US012379642B2

(12) United States Patent
Chuang et al.

(10) Patent No.: US 12,379,642 B2
(45) Date of Patent: Aug. 5, 2025

(54) TUNABLE DUV LASER ASSEMBLY

(71) Applicant: KLA Corporation, Milpitas, CA (US)

(72) Inventors: Yung-Ho Alex Chuang, Cupertino, CA (US); Yinying Xiao-Li, San Jose, CA (US); John Fielden, Los Altos, CA (US); Baigang Zhang, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 757 days.

(21) Appl. No.: 17/702,683

(22) Filed: Mar. 23, 2022

(65) Prior Publication Data

US 2022/0399694 A1    Dec. 15, 2022

Related U.S. Application Data

(60) Provisional application No. 63/209,413, filed on Jun. 11, 2021.

(51) Int. Cl.
*G02F 1/35* (2006.01)
*G02F 1/355* (2006.01)
(Continued)

(52) U.S. Cl.
CPC ............ *G02F 1/354* (2021.01); *G02F 1/3551* (2013.01); *H01S 3/109* (2013.01); *H01S 5/0092* (2013.01); *H01S 3/0092* (2013.01)

(58) Field of Classification Search
CPC ...... G02F 1/354; G02F 1/3551; H01S 3/0092; H01S 3/109; H01S 5/0092
See application file for complete search history.

(56) References Cited

U.S. PATENT DOCUMENTS 5,144,630 A    9/1992 Lin
5,742,626 A    4/1998 Mead et al.
(Continued)

FOREIGN PATENT DOCUMENTS

CN    102324689 A    1/2012
CN    110068979 A    7/2019
(Continued)

OTHER PUBLICATIONS

Kabainski, Adeline et al., Optics Letters entitled "Wavelength tunable, single-longitudinal-mode optical parametric oscillator with a transversally chirped volume Bragg grating", vol. 45, No. 3, Feb. 1, 202, pp. 607-610 (4 pages).
(Continued)

*Primary Examiner* — Daniel Petkovsek
(74) *Attorney, Agent, or Firm* — Bever, Hoffman & Harms, LLP

(57) ABSTRACT

A tunable laser assembly uses a fundamental wavelength between 1 μm and 1.1 μm to alternately generate laser output light at two or more output wavelengths within the range of 184 nm to 200 nm by directing the fundamental light through different regions of a fan-out periodically poled nonlinear crystal to generate corresponding different down-converted signals, and using different nonlinear summing crystals to mix the different down-converted signals with a fifth harmonic of the fundamental wavelength. Each nonlinear summing crystal has a crystal axis aligned at an angle relative to the light propagation direction to facilitate the efficient transmission and summing of the fifth harmonic with an associated down-converted signal. In response to a user-selected output wavelength, a frequency control system positions the fan-out periodically poled nonlinear crystal to generate a corresponding down-converted signal frequency and positions an associated nonlinear summing crystal to
(Continued)

receive the fifth harmonic and the corresponding down-converted signal.

20 Claims, 9 Drawing Sheets

(51) Int. Cl.
*H01S 3/109* (2006.01)
*H01S 5/00* (2006.01)
*H01S 3/00* (2006.01)

(56) References Cited

U.S. PATENT DOCUMENTS

| | | | |
|---|---|---|---|
| 6,201,601 | B1 | 3/2001 | Vaez-Iravani et al. |
| 6,271,916 | B1 | 8/2001 | Marxer et al. |
| 7,525,649 | B1 | 4/2009 | Leong et al. |
| 7,623,557 | B2 | 11/2009 | Tokuhisa et al. |
| 7,817,260 | B2 | 10/2010 | Chuang et al. |
| 8,298,335 | B2 | 10/2012 | Armstrong |
| 8,824,514 | B2 | 9/2014 | Armstrong |
| 8,976,343 | B2 | 3/2015 | Genis |
| 9,023,152 | B2 | 5/2015 | Dribinski |
| 9,059,560 | B2 | 6/2015 | Dribinski et al. |
| 9,250,178 | B2 | 2/2016 | Chuang et al. |
| 9,293,882 | B2 | 3/2016 | Chuang |
| 9,318,870 | B2 | 4/2016 | Lei et al. |
| 9,419,407 | B2 | 8/2016 | Deng et al. |
| 9,459,215 | B2 | 10/2016 | Chuang et al. |
| 9,461,435 | B2 | 10/2016 | Dribinski et al. |
| 9,509,112 | B2 | 11/2016 | Chuang et al. |
| 9,529,182 | B2 | 12/2016 | Chuang et al. |
| 9,608,399 | B2 | 3/2017 | Chuang et al. |
| 9,660,409 | B2 | 5/2017 | Chuang |
| 9,748,729 | B2 * | 8/2017 | Chuang .................. G02F 1/353 |
| 9,891,177 | B2 | 2/2018 | Vazhaeparambil et al. |
| 10,044,166 | B2 | 8/2018 | Chuang et al. |
| 10,175,555 | B2 * | 1/2019 | Chuang .................. G02F 1/3501 |
| 10,199,149 | B2 | 2/2019 | Chuang et al. |
| 10,282,366 | B2 | 5/2019 | Cai et al. |
| 10,429,719 | B2 | 10/2019 | Chuang |
| 10,495,582 | B2 | 12/2019 | Deng et al. |
| 10,809,594 | B2 | 10/2020 | Yu et al. |
| 10,921,261 | B2 | 2/2021 | Chuang et al. |
| 11,009,773 | B2 * | 5/2021 | Zhong .................. G02F 1/39 |
| 11,180,866 | B2 | 11/2021 | Chuang et al. |
| 11,237,455 | B2 | 2/2022 | Chuang et al. |
| 11,567,391 | B1 * | 1/2023 | Chuang .................. G02F 1/3503 |
| 2005/0163187 | A1 | 7/2005 | Spinelli et al. |
| 2016/0116822 | A1 | 4/2016 | Kaneda |
| 2016/0240996 | A1 | 8/2016 | Vogler et al. |
| 2017/0229829 | A1 | 8/2017 | Chuang et al. |
| 2018/0034227 | A1 | 2/2018 | Trull-Silvestre et al. |
| 2021/0010948 | A1 | 1/2021 | Chuang et al. |
| 2022/0066283 | A1 | 3/2022 | Gapontsev et al. |
| 2022/0066284 | A1 | 3/2022 | Perlov et al. |

FOREIGN PATENT DOCUMENTS

| | | |
|---|---|---|
| EP | 1255331 A1 | 11/2002 |
| WO | 2017004528 A1 | 1/2017 |
| WO | 2020131652 A1 | 6/2020 |
| WO | 2020132043 | 6/2020 |

OTHER PUBLICATIONS

Aleksandrovsky, A.S., article entitled "Nonlinear optical processes and DUV generation in random domain structures of SBO", 2015 Conference on Lasers and Electro-Optics (CLEO), 2015, pp. 1-2 (Year: 2015).

Aleksandrovsky, A.S., et al., article entitled "Nonlinear Diffraction and Random QPM in Strontium Tetraborate", CAOL Sep. 29-Oct. 4, 2008, Ukraine, 978-1-4244-1974-6, 2008 IEEE, 3 pages.

Aleksandrovsky, A.S., et al. articled entitled "Conversion of radiation in nonlinear photonic crystals of strontium tetraborate", CLEO/Europe—EQEC 2009—European Conference on Lasers and Electro-Optics and the European Quantum Electronics Conference, 2009, pp. 1 (Year: 2009).

Faris, Gregory W. et al., article entitled "Two-photon excitation of neon at 133 nm", Optics Letters, vol. 18, No. 5, Mar. 1, 2003, 3 pages.

Kurimura, Sunao et al., article entitled "Quartz revisits nonlinear optics: twinned crystal for quasi-phase matching [Invited]", Optical Materials Express 1375, Nov. 1, 2011, vol. 1, No. 7, 9 pages.

Oseledchik, Yu S., et al., article entitled "New nonlinear optical crystals: strontium and lead tetraborates", Optical Materials 4, Jun. 15, 1995, pp. 669-674.

Petrov, Valentin et al., article entitled "Application of the nonlinear crystal SrB4O7 for ultrafast diagnostics converting to wavelengths as short as 125 nm", Optics Letters, Feb. 15, 2004, vol. 29, No. 4, 3 pages.

Szilagyi, A., et al., article entitled "A quasi-phase-matching technique for efficient optical mixing and frequency doubling", Journal of Applied Physics 47.2025 (1976), published online: Aug. 28, 2008, 9 pages.

Trabs, Peter et al., article entitled "Generation of Coherent Vacuum UV Radiation in Randomly Quasi-Phase-Matched Strontium Tetraborate", Optics Letters, May 2015, 3 pages.

Trabs, Peter et al., article entitled "Spectral fringes in non-phase-matched SHG and refinement of dispersion relations in the VUV", Optical Society of America, published Apr. 10, 2015, vol. 23, No. 8, Optics Express 10091, 6 pages.

Tunnermann, Andreas et al., "Generation of Tunable Short Pulse VUV Radiation by Four-Wave Mixing in Xenon with Femtosecond KrF-Excimer Laser Pulses", IEEE Journal of Quantum Electronics, Vo. 29, No. 4, Apr. 1993, 6 pages.

Villora, Encarnacion G., et al., article entitled "Birefringent- and quasi phase-matching with BaMgF4 for vacuum-UV/UV and mid-IR all solid-state lasers", Optical Society of America, published Jul. 6, 2009, vol. 17, No. 15, 17 pages.

\* cited by examiner

TUNABLE DUV LASER ASSEMBLY

PRIORITY APPLICATION

This application claims priority from U.S. Provisional Patent Application No. 63/209,413, entitled "DUV Tunable Laser Using OPO", which was filed on Jun. 11, 2021, and is incorporated by reference herein.

RELATED PATENTS

This application is related to the following U.S. patent documents, all of which are incorporated by reference herein: U.S. Pat. No. 10,199,149 to Chuang et al., U.S. Pat. No. 9,748,729 to Chuang et al., U.S. Pat. No. 9,529,182 to Chuang et al., U.S. Pat. No. 9,608,399 to Chuang et al.

BACKGROUND OF THE DISCLOSURE

Field of the Disclosure

The present application relates to lasers capable of generating light having deep ultraviolet (DUV) wavelengths, and more particularly to tunable lasers capable of generating light having two or more wavelengths within in the range of approximately 184 nm to approximately 200 nm, and to inspection systems that use such lasers to inspect, e.g., photomasks, reticles, and semiconductor wafers.

Related Art

As semiconductor devices' dimensions shrink, the size of the smallest particle or pattern defect that can cause a device to fail also shrinks. Hence a need arises for detecting smaller particles and defects on patterned and unpatterned semiconductor wafers and reticles. The intensity of light scattered by particles smaller than the wavelength of that light generally scales as a high power of the dimensions of that particle (for example, the total scattered intensity of light from an isolated small spherical particle scales proportional to the sixth power of the diameter of the sphere and inversely proportional to the fourth power of the wavelength). Because of the increased intensity of the scattered light, shorter wavelengths will generally provide better sensitivity for detecting small particles and defects than longer wavelengths.

Since the intensity of light scattered from small particles and defects is generally very low, high illumination intensity is required to produce a signal that can be detected in a very short time. Average light source power levels of 0.3 W or more may be required. At these high average power levels, a high pulse repetition rate is desirable as the higher the repetition rate, the lower the energy per pulse and hence the lower the risk of damage to the system optics or the article being inspected. The illumination needs for inspection and metrology are generally best met by continuous wave (CW) light sources. A CW light source has a constant power level, which avoids the peak power damage issues and also allows for images or data to be acquired continuously. However, in some cases, mode-locked lasers with repetition rates of about 50 MHz or higher may be useful because the high repetition rate means that the energy per pulse can be low enough to avoid damage for certain metrology and inspection applications.

Pulsed lasers for generating deep ultraviolet (DUV) light are known in the art. Prior-art excimer lasers for generating light at 193 nm are well-known. Unfortunately, such lasers are not well suited to inspection applications because of their low laser pulse repetition rates and their use of toxic and corrosive gases in their lasing medium, which leads to high cost of ownership. A small number of solid state and fiber-based lasers for generating light near 193 nm output are also known in the art. Exemplary lasers use two different fundamental wavelengths (e.g., US 2014/0111799 by Lei et al.) or the eighth harmonic of the fundamental (e.g., U.S. Pat. No. 7,623,557 by Tokuhisa et al.), either of which requires lasers or materials that are expensive or are not in high volume production. Another approach (U.S. Pat. No. 5,742,626 to Mead et al.) has not resulted in a commercial product with stable output and high power as required for semiconductor inspection applications (approximately 0.3 W or more is typically required in a laser that can run continuously for three or more months between service events). Moreover, most of these lasers have very low power output and are limited to laser pulse repetition rates of a few MHz or less. Chuang et al. (US Pub. App. No. 2016/0099540) discloses a 183 nm mode-locked laser and related inspection system.

A pulsed light source has an instantaneous peak power level much higher than the time-averaged power level of a CW light source. The very high peak power of the laser pulses can result in damage to the optics and to the sample or wafer being measured, as most damage mechanisms are nonlinear and depend more strongly on peak power rather than on average power. The higher the pulse repetition rate, the lower the instantaneous peak power per pulse for the same time-averaged power level.

None of the existing conventional laser assemblies allow a user to selectively tune (i.e., vary, adjust) the laser output light between two significantly different DUV wavelengths (i.e., wavelengths that differ by five or more nanometers). The ability to adjust a single laser assembly to generate two or more different DUV wavelengths (e.g., such that the laser outputs light having a wavelength of approximately 184 nm during a first time period and a wavelength of approximately 194 nm during a second time period) would greatly enhance an inspection system's ability to detect certain defects that might not be detected or accurately identified using a single DUV output wavelength. That is, if a wafer/reticle were inspected using two different DUV wavelengths, the shape, size and/or material of a given defect may produce substantially more reflection at a first DUV wavelength than at a second DUV wavelength. Similarly, the reflectivity of the pattern surrounding the defect also has a reflectivity that may differ at the two DUV wavelengths. Hence selection of an appropriate wavelength can enable improved contrast between the defect and the pattern and further enhance detection of the defect. Because conventional DUV laser assemblies only generate a single wavelength (e.g., approximately 193 nm), a wafer/reticle inspection system using such a laser may fail to detect or accurately identify critical defects on a wafer/reticle Therefore, a need arises for a user-tunable mode-locked or CW laser that generates laser output light at two or more DUV wavelengths, particularly in the range of approximately 184 nm to approximately 200 nm. Also, a need arises for an inspection system and associated method that are capable of generating mode-locked or CW tunable laser light having two or more output DUV wavelengths in the range of approximately 184 nm to approximately 200 nm and avoid some, or all, of the problems and disadvantages mentioned above.

SUMMARY OF THE DISCLOSURE

The present invention relates to an improvement in inspection systems utilized in the semiconductor fabrication industry, and in particular to a tunable laser assembly and associated methods for such inspection systems that utilize an adjustable fan-out periodically poled nonlinear optical crystal (fan-out PPNLC) in combination with an interchangeable set of two or more nonlinear summing crystals that are operably controlled by a frequency control system to generate laser light having a light source power level of 0.3 W or more and a user-selected output frequency/wavelength that varies (e.g., in response to a user-supplied output frequency signal) within the range of approximately 184 nm to approximately 200 nm. The tunable laser assembly utilizes one or more fundamental lasers to generate fundamental light having a wavelength between about 1 µm and 1.1 µm and utilizes a fifth harmonic generator to convert a portion of fundamental light into fifth harmonic light. The fan-out PPNLC is movably positioned relative a second portion of fundamental light and is configured such that two or more different down-converted frequencies are generated when the second fundamental light portion is directed through two or more corresponding different regions of the fan-out PPNLC's crystal body. The nonlinear summing crystals are provided with corresponding different crystal axis orientations to facilitate efficient summing of the fifth harmonic light with a wide range of different down-converted frequencies (e.g., with the crystal axis orientation of a first summing crystal being configured to efficiently process relatively low down-converted frequencies and the crystal axis orientation of a second summing crystal being configured to efficiently process relatively high down-converted frequencies). In response to different user-supplied output frequency signal values, the frequency control system positions/orients the various crystals such that the fan-out PPNLC generates down-converted light at a selected down-converted frequency that, when summed with the fifth harmonic light by a corresponding selected nonlinear summing crystal, produces DUV laser light at a selected DUV wavelength within the range of approximately 184 nm to approximately 200 nm. The combined use of a fan-out PPNLC and two or more interchangeable nonlinear summing crystals allows the tunable laser assembly to switch laser output light between two or more different DUV wavelengths that vary by 5 nm or more during the inspection of a wafer/reticle, thereby greatly enhancing the detection of certain defects (e.g., by maximizing contrast between each defect and the surrounding non-defective pattern), thus allowing a user to detect/analyze defects that might not be detectable using a single DUV frequency (e.g., only 184 nm light, or only 194 nm light). Note that in the following description, where a wavelength is mentioned without qualification, that wavelength may be assumed to be the wavelength in vacuum.

According to an exemplary embodiment of the invention, the fifth harmonic light is generated by a fifth harmonic generation stage configured to mix fundamental light and fourth harmonic light generated by a fourth harmonic generation module, which in some embodiments is implemented using two frequency doubling stages. In one embodiment, the first frequency doubling stage generates second harmonic light using a Lithium triborate (LBO) crystal, which can be substantially non-critically phase-matched (for an appropriate choice of crystal plane) at temperatures between room temperature and about 200° C. for producing a second harmonic in a wavelength range between about 515 nm and about 535 nm. In alternative embodiments, the first frequency doubling stage may include a Cesium Lithium Borate (CLBO) crystal or a beta-Barium Borate (BBO) crystal, either of which can be critically phase matched for generating a second harmonic in a wavelength range between about 515 nm and about 535 nm. In other alternative embodiments, the first frequency doubling stage may include a KTiOPO4 (KTP), periodically-poled lithium niobate (PPLN), periodically-poled stoichiometric lithium tantalate (PPSLT), or other nonlinear crystal for frequency conversion. In one embodiment, the second frequency doubling stage generates fourth harmonic light using critical phase matching in CLBO, BBO or other nonlinear crystal materials. In preferred embodiments, the second frequency doubling stage includes a hydrogen-treated or deuterium-treated CLBO crystal. In alternative embodiments, the fifth harmonic generation stage is configured to mix the fundamental light and fourth harmonic light directly without a cavity using a nonlinear crystal as in the case of pulsed lasers, or with a cavity for CW lasers by circulating the fundamental light in a cavity configured to resonate at the fundamental frequency such that the circulated fundamental light passes through a nonlinear crystal, and directing the fourth harmonic light such that it also passes through the nonlinear crystal (i.e., without being circulated in the cavity) in a manner that combines the fourth harmonic light and the circulated first fundamental light to generate the fifth harmonic light. These specific arrangements provide a fifth harmonic generator that is capable of generating fifth harmonic light at a power level suitable for inspection systems.

According to an embodiment, the tunable laser assembly includes an optical parametric system (OPS) that is configured to circulate the down-converted frequency through the fan-out PPNLC to further enhance the power of the down-converted light passed to the nonlinear summing crystal set. In alternative embodiments, the OPS is implemented as either an optical parametric oscillator (OPO) or an optical parametric amplifier (OPA) that is configured to generate the down-converted signal at a down-converted wavelength approximately between about 1350 nm and about 3300 nm such that, when mixed with the fifth harmonic light based on the 1064 nm fundamental frequency, causes the tunable laser assembly to generate laser output light at a wavelength between about 184 nm and about 200 nm. In one embodiment, the OPS includes both the PPNLC and a reflective-type wavelength selector (e.g., a volume Bragg grating, a distributed Bragg reflector or a Littrow grating). In another embodiment, the OPS includes both the PPNLC and a transmissive-type wavelength selector (e.g., a transmission grating or an etalon). In some embodiments, small adjustments to the wavelength of the laser output can be made by adjusting the temperature of the wavelength selector in order to change the down-converted frequency.

According to an embodiment of the invention, the DUV laser output light is generated by mixing the down-converted laser light with the fifth harmonic light using a selected nonlinear summing crystal of the nonlinear summing crystal set. The frequency summing is preferably performed in a cavity in which the down-converted signal is circulated. In a CW laser, the cavity is configured to resonate at the down-converted frequency and to direct the circulated down-converted signal through the selected nonlinear summing crystal. In a pulsed laser, the cavity length is configured so that circulating pulses overlap with incoming pulses. In either case, the fifth harmonic light is directed to pass through the selected nonlinear summing crystal (i.e., without being circulated) in a manner that combines the fifth harmonic light and the circulated down-converted laser light. By providing a cavity configured to circulate light at the down-converted frequency the power of the light at the down-converted frequency in the nonlinear summing crystal is greatly increased relative to what it would have been without the cavity thereby increasing the conversion efficiency.

According to another embodiment, a tunable laser utilizes single cavity arrangement that is configured to selectively circulate unconsumed down-converted light exiting one of the nonlinear summing crystals such that the unconsumed down-converted light is directed back through the fan-out PPNLC. By arranging a single set of mirrors to circulate light at the down-converted frequency and to direct the down-converted light along a continuous path that passes through both the nonlinear summing crystal set and the fan-out PPNLC, the single cavity arrangement simplifies the laser and increases the conversion efficiency in comparison to multiple cavity embodiments.

In one embodiment, an inspection system configured to inspect a sample such as a wafer, reticle or photomask includes one of the lasers described herein that generates an output wavelength in the range of approximately 184 nm to approximately 200 nm.

DETAILED DESCRIPTION OF THE DRAWINGS

The present invention relates to an improvement in lasers for semiconductor inspection systems. The following description is presented to enable one of ordinary skill in the art to make and use the invention as provided in the context of a particular application and its requirements. As used herein, directional terms such as "top", "left", "right", "horizontal" and "downward" are intended to provide relative positions for purposes of description and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 1:
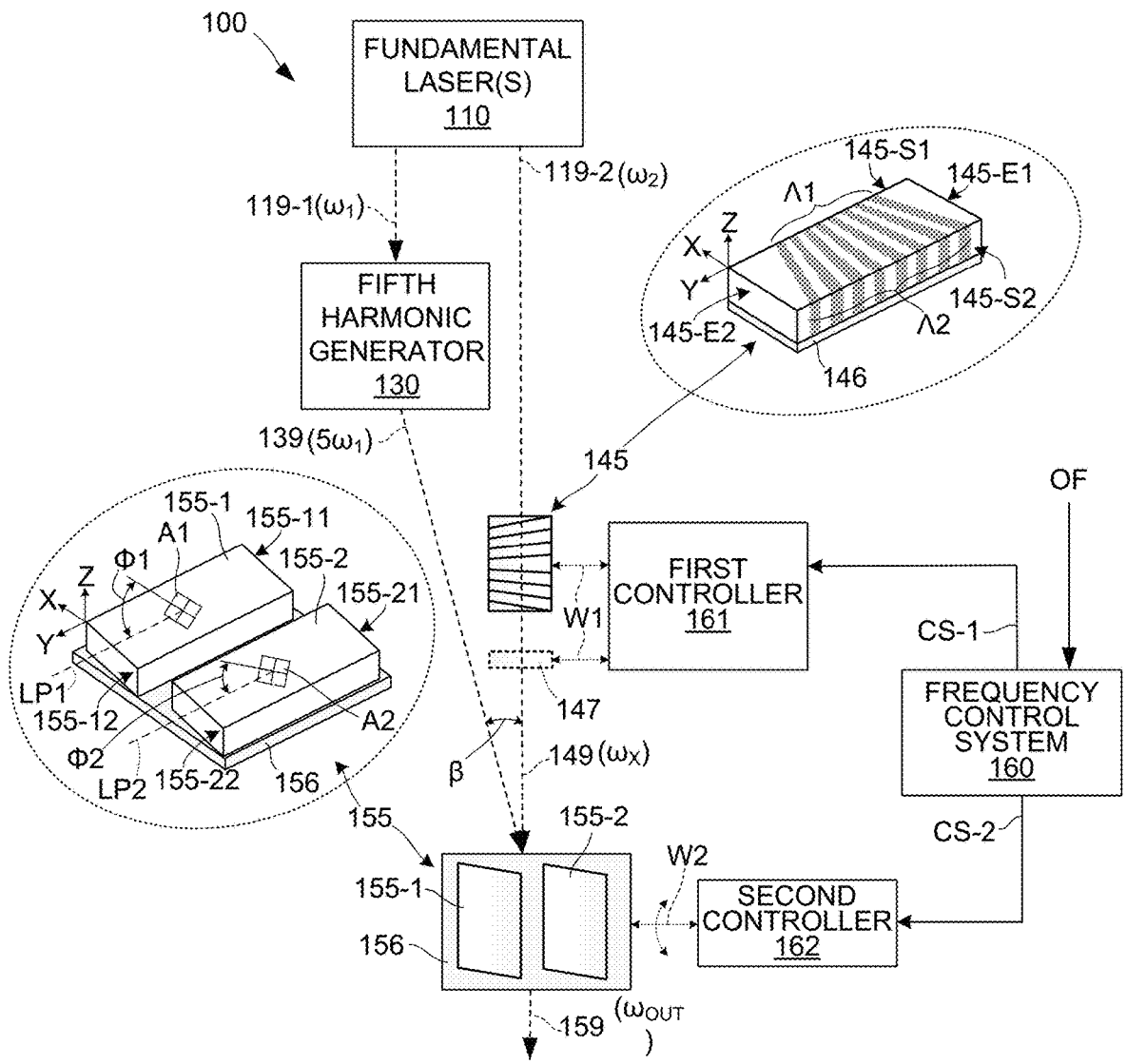
FIG. 1 is a simplified block diagram showing a simplified tunable laser assembly according to a generalized embodiment of the present invention.

FIG. 1 is a simplified block diagram showing a tunable laser assembly 100 configured to generate a pulsed or CW deep ultraviolet (DUV) output light 159 having a tunable output frequency $\omega_{OUT}$ with a corresponding wavelength that is selectively adjustable in the range of approximately 184 nm to approximately 200 nm according to a generalized embodiment. Tunable laser assembly 100 generally includes one or more fundamental lasers 110, a fifth harmonic generator 130, a fan-out periodically poled nonlinear crystal (PPNLC) 145, an optional wavelength selector 147, a set of nonlinear summing crystals 155, and a frequency control system 160. In exemplary embodiments described below, fundamental lasers 110 are configured to generate first and second fundamental frequencies $\omega_1$ and $\omega_2$ an infra-red fundamental wavelength of approximately 1064 nm, and fan-out PPNLC 145 is configured to generate down-converted signal 149 with a down-converted frequency $\omega_x$ having a corresponding wavelength between approximately 1350 nm and approximately 3300 nm, and nonlinear summing crystal set 155 includes at least two nonlinear summing crystals that are cooperatively configured to generate laser output light 159 with output frequency $\omega_{OUT}$ having a wavelength in the range of approximately 184 nm to approximately 200 nm.

Fundamental laser(s) 110 are configured using known techniques to generate fundamental light beams 119-1 and 119-2 (referred to simply as "fundamentals" in the industry) having corresponding fundamental frequencies $\omega_1$ and $\omega_2$ with corresponding fundamental wavelengths between about 1 μm and 1.1 μm. In an exemplary embodiment, fundamental lasers 100 are implemented using one of a Nd:YAG (neodymium-doped yttrium aluminum garnet) lasing medium, a Nd-doped yttrium orthovanadate lasing medium, or by an ytterbium-doped (Yb-doped) fiber lasing medium or fiber amplifier. In order to generate sufficient light at a wavelength between about 184 nm and about 200 nm for inspecting semiconductor wafers or reticles, fundamental laser 110 should generate fundamental light 119-1 and 119-2 with an average power of tens or hundreds of Watts or more. Suitable fundamental lasers are commercially available as pulsed (mode-locked or quasi-CW) from Coherent Inc. (including models in the Paladin family with repetition rates of 80 MHz and 120 MHz), Newport Corporation (including models in the Explorer family) and other manufacturers. Laser power levels for such fundamental lasers can range from milliWatts to tens of Watts or more. In an alternate exemplary embodiment, fundamental laser 110 is implemented by a laser using a Nd:YLF (neodymium-doped yttrium lithium fluoride) lasing medium that generates fundamental laser light at a fundamental wavelength of approximately 1053 nm or approximately 1047 nm. In yet another exemplary embodiment, fundamental laser 110 can be implemented by an ytterbium-doped fiber laser that generates fundamental laser light at a fundamental wavelength of approximately 1030 nm. In some embodiments, the light generated by one fundamental laser may be divided into two light portions 119-1 and 119-2, whereby second fundamental frequency $\omega_2$ is necessarily equal to first fundamental frequency $\omega_1$.

Fifth harmonic generator 130 is configured using known techniques (e.g., as described below with reference to FIG. 2) to generate a fifth harmonic light beam (fifth harmonic) 139 equal to five times fundamental frequency $\omega_1$ (i.e., having a corresponding fifth harmonic wavelength between about 200 nm and about 220 nm).

Fan-out PPNLC 145 is configured to receive second fundamental light portion 119-2 and is configured to generate down-converted signal 149 at a selected down-converted frequency $\omega_x$. Referring to the bubble in the upper right portion of FIG. 1, in one embodiment fan-out PPNLC 145 is a crystal structure that is mounted on a suitable platform 146 (e.g., an X-θ table) and has opposing first and second end surfaces 145-E1 and 145-E2 that define parallel X-Z planes (using the indicated X-Y-Z coordinates) and opposing first and second side surfaces 145-S1 and 145-S2 that extend in parallel (e.g., in the Y-axis direction) between end surfaces 145-E1 and 145-E2. Fan-out PPNLC 145 is fabricated using known techniques to include a fan-out periodically poled configuration that gradually increases from a minimum (first) poling period Λ1 adjacent a first side edge 145-S1 to a maximum (second) poling period Λ2 adjacent opposing (second) side edge 145-S1 (e.g., as indicated by shaded regions). As discussed below with reference to FIGS. 1A and 1B, this fan-out periodically poled configuration generates down-converted signal 149 at a selected down-converted frequency $\omega_x$ that depends on the poling period encountered by second fundamental light portion 119-2 as it passes though fan-out PPNLC 145 between end surfaces 145-E1 and 145-E2. In alternative embodiments, fan-out PPNLC 145 may comprise one or more of lithium niobate (PPLN), magnesium-oxide doped lithium niobate (Mg:LN), stoichiometric lithium tantalate (SLT), magnesium-oxide doped stoichiometric lithium tantalate (Mg:SLT) and potassium titanyl phosphate (KTP).

Figure 3:
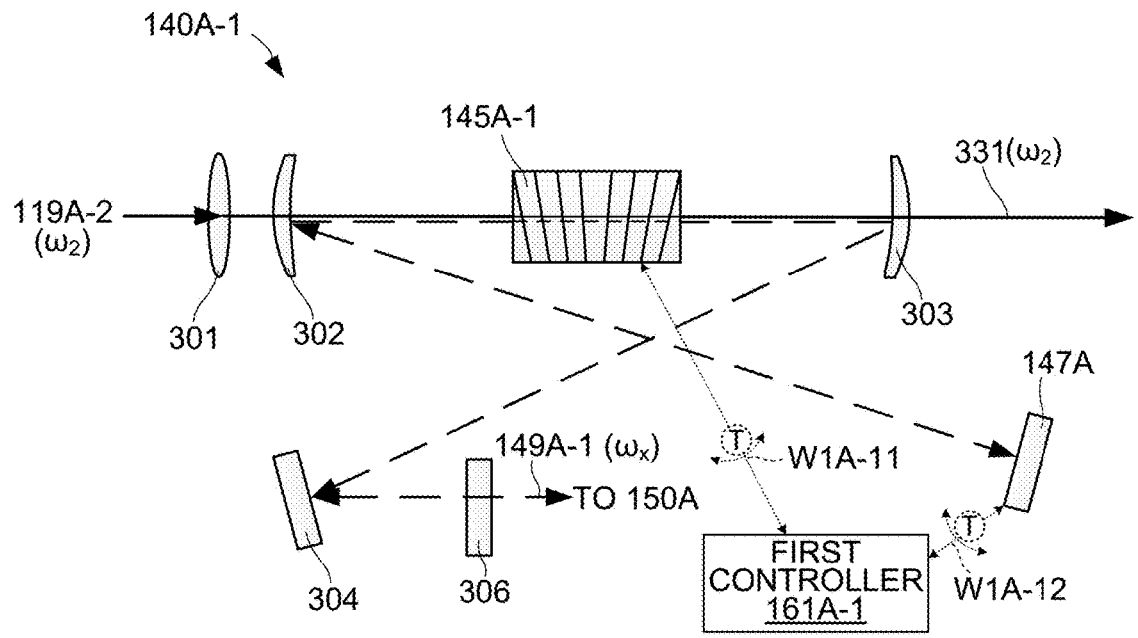
FIG. 3 is a simplified diagram showing an exemplary OPO configured to generate a down-converted signal that is used in a pulsed-laser version of the tunable assembly of FIG. 2 according to an exemplary embodiment of the present invention.

In some embodiments down-converted frequency $\omega_x$ is transmitted through or reflected by a wavelength selector 147 that is configured to filter out frequencies falling outside of a narrow effective bandwidth centered around each selected down-converted frequency $\omega_x$. In the case indicated in FIG. 1 and described below with reference to FIG. 4, wavelength selector 147 may comprise one or more transmissive-type elements that are disposed in path of down-converted light 149 (i.e., such that down-converted light 149 transmitted from fan-out PPNLC 145 passes through wavelength selector 147 to nonlinear summing crystal set 155). In other cases (e.g., as indicated in FIG. 3, discussed below), wavelength selector 147 may comprise one or more reflective-type elements that are positioned outside of the path between fan-out PPNLC 145 and nonlinear summing crystal set 155 (i.e., such that down-converted signal 149 is transmitted from fan-out PPNLC 145 to nonlinear summing crystal set 155 by reflection from wavelength selector 147). In yet other embodiments, such as that described below with reference FIG. 6, wavelength selector 147 may comprise one or more transmissive-type elements and one or more reflective-type elements. Moreover, wavelength selector 147 may be omitted in cases where the effective bandwidth of light leaving fan-out PPNLC 145 is sufficiently narrow and centered around the selected down-converted frequency $\omega_x$. In any case, down-converted signal 149 is transmitted from fan-out PPNLC 145 and is directed to nonlinear summing crystal set 155.

Figures 1A, 1B:
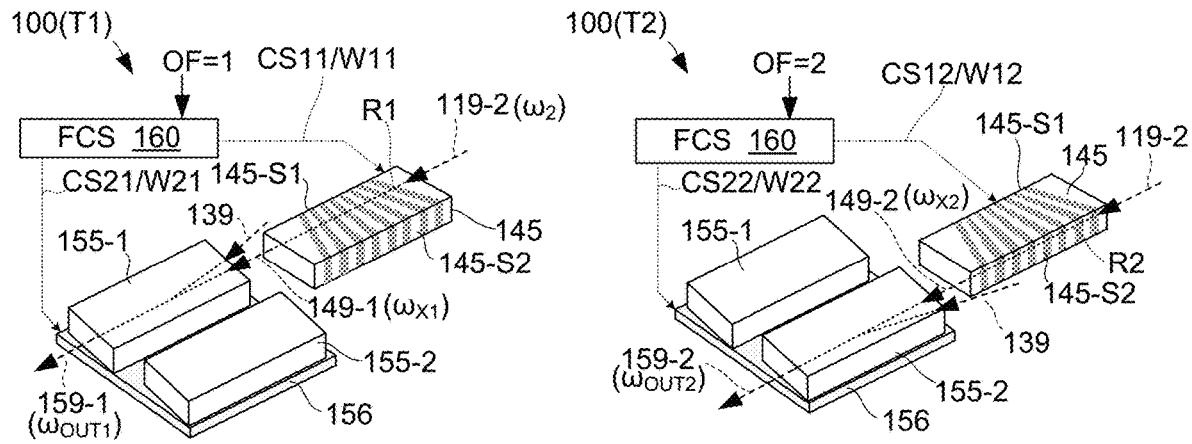
FIGS. 1A and 1B are simplified perspective views showing a portion of the tunable laser assembly of FIG. 1 during operation.

Referring to the lower portion of FIG. 1, fifth harmonic 139 and down-converted signal 149 are directed substantially collinearly onto nonlinear summing crystal set 155 (i.e., at a relative angle β that is 5° or less). In the generalized embodiment nonlinear summing crystal set 155 includes two (first and second) nonlinear summing crystals 155-1 and 155-2 that are alternatively selectively positioned to receive fifth harmonic 139 and down-converted signal 149 (i.e., such that either first nonlinear summing crystal 155-1 receives the fifth harmonic and down-converted signal as depicted in FIG. 1A, or such that second nonlinear summing crystal 155-2 receives the fifth harmonic and down-converted signal as depicted in FIG. 1B). As indicated in the bubble disposed on the left side of FIG. 1, in a preferred embodiment first and second nonlinear summing crystals 155-1 and 155-2 are maintained in a fixed relationship (e.g., by way of being fixedly mounted on an X-Y-θ table or other selectively movable frame 156) such that both crystals are parallel to a light propagation (Y-axis) direction (i.e., the direction in which down-converted light 149 is directed toward set 155). With this arrangement, during one operating mode (described below with reference to FIG. 1A), nonlinear summing crystal 155-1 is positioned such that fifth harmonic 139 and down-converted signal 149 enter crystal 155-1 through input surface 155-11 and pass along light path LP1 to output surface 155-12, and during a second operating mode (described below with reference to FIG. 1B), nonlinear summing crystal 155-2 is positioned such that fifth harmonic 139 and down-converted signal 149 enter crystal 155-2 through input surface 155-21 and pass along light path LP2 to output surface 155-22.

According to an aspect of the invention, both nonlinear summing crystals 155-1 and 155-2 comprise the same nonlinear crystal material, and each nonlinear summing crystal 155-1 and 155-2 is fabricated (e.g., cut) with a different crystal axis orientation relative to its input/output surfaces to facilitate phase matching over corresponding different ranges of signal and output frequencies. In presently preferred embodiments, nonlinear summing crystals 155-1 and 155-2 comprises one of an annealed cesium lithium borate (CLBO) crystal, a hydrogen-treated CLBO crystal, a deuterium-treated CLBO crystal, and a strontium tetraborate (SBO) crystal. As indicated in the bubble disposed on the left side of FIG. 1, first nonlinear summing crystal 155-1 has a corresponding (first) crystal axis A1 that is oriented at an angle φ1 relative to light propagation direction LP1, and second nonlinear summing crystal 155-2 has a corresponding (second) crystal axis A2 that is oriented at a corresponding (second) angle φ2 relative to light propagation direction LP2. In a presently preferred embodiment, nonlinear summing crystal 155-1 and 155-2 are fabricated such that, when disposed in a parallel relationship such as that indicated in FIG. 1, angle φ1 differs from angle φ2 by at least 5 degrees. By fabricating nonlinear summing crystals 155-1 and 155-2 using known techniques such that crystal axes A1 and A2 are aligned at appropriate angles φ1 and φ2 relative to the light propagation direction, nonlinear summing crystals 155-1 and 155-2 facilitate the efficient summing of fifth harmonic light 139 with two or more different down-converted signal frequencies that typically could not be efficiently processed by a single nonlinear summing crystal, thereby allowing tunable laser assembly 100 to generate DUV output light at significantly different DUV frequencies within the range of about 184 nm to about 200 nm.

Frequency control system 160 is configured to receive a user-selected tunable output frequency $\omega_{OUT}$ (e.g., as defined by an output frequency signal OF) and to cooperatively adjust (configure) the relative positions and orientations of fan-out PPNLC 145, optional wavelength selector 147 and nonlinear summing crystal 155 such that tunable laser assembly 100 generates DUV output light 159 at two or more different user-specified DUV output frequencies. In an exemplary embodiment frequency control system 160 performs the cooperative adjustments by way of transmitting coordinated control signals CS-1 an CS-2 to corresponding first and second controllers 161 and 162, whereby controllers 161 and 162 apply associated wavelength adjustments W1 and W2 on fan-out PPNLC 145, optional wavelength selector 147 and nonlinear summing crystal 155. For example, FIG. 1A depicts a relevant portion of tunable laser assembly 100 during a first operating time period T1 (indicated by "100(T1)") when frequency control system (FCS) 160 receives output frequency signal OF with an exemplary (first) output frequency signal value (i.e., "OF=1") that signals a user's desire for tunable laser assembly 100 to generate a relatively high DUV output light frequency $\omega_{OUT1}$. In response to the first output frequency signal value ("OF=1"), frequency control system 160 generates first control signals CS11 and CS21. Control signal CS11 causes controller 161 (FIG. 1) to apply first wavelength adjustment W11 to position fan-out PPNLC 145 and optional wavelength selector 147 (not shown in FIG. 1A) such that fundamental light portion 119-2 passes through a first region R1 (e.g., such that fundamental light portion 119-2 passes between the opposing end edges along a path that is closer to side edge 145-S1 than to opposing side edge 145-S2), thereby causing fan-out PPNLC 145 and optional wavelength selector 147 (not shown) to generate a corresponding (first) down-converted signal 149-1 having a relatively high (first) down-converted frequency $\omega_{x1}$. In addition, control signal CS12 causes controller 162 (FIG. 1) to generate wavelength adjustment W21 that manipulates frame 156 such that both fifth harmonic light 139 and down-converted signal 149-1 are operably focused inside nonlinear summing crystal 155-1, thereby generating DUV output light 159-1 with the user-selected DUV wavelength $\omega_{OUT1}$. FIG. 1B depicts a relevant portion of tunable laser assembly 100 during a second operating time period T2 (indicated by "100(T2)") when FCS 160 receives output frequency signal OF with a different (second) output frequency signal value (i.e., "OF=2") that signals a user's desire for tunable laser assembly 100 to generate a different output light frequency (e.g., when the user wishes to perform analysis using DUV output light 159-2 having a relatively low DUV frequency $\omega_{OUT2}$). In response to the second output frequency value, FCS 160 generates a second (different) set of control signals CS12 and CS22 that produce corresponding adjustments W11 and W12. Control signal/adjustment CS12/W12 reposition fan-out PPNLC 145 and optional wavelength selector 147 (not shown in FIG. 1B) such that fundamental light portion 119-2 passes through a second region R2 (e.g., such that fundamental light portion 119-2 passes along a path that is closer to side edge 145-S2 than to opposing side edge 145-S1), thereby causing fan-out PPNLC 145 and optional wavelength selector 147 (not shown) to generate a corresponding (second) down-converted signal 149-2 having a relatively low (second) down-converted frequency $\omega_{x2}$, and control signal/adjustment CS22/W22 manipulates frame 156 such that both fifth harmonic light 139 and down-converted signal 149-2 are operably focused inside nonlinear summing crystal 155-2, thereby generating DUV output light 159-2 with the user-selected DUV wavelength $\omega_{OUT2}$.

In addition to the positional adjustments shown in FIGS. 1A and 1B, frequency control system 160 is further configured to operably control wavelength selector 147 (e.g., by way of first controller 161) such that, when the output frequency signal has the first value (OF=1), wavelength selector 147 is configured to filter out frequencies falling outside of an effective bandwidth centered around first down-converted frequency $\omega_{x1}$, and when the output frequency signal has the second value (OF=2), wavelength selector 147 is configured to filter out frequencies falling outside of an effective bandwidth centered around second down-converted frequency $\omega_{x2}$. Operable control of wavelength selector 147 may involve, for example, translation or rotation of wavelength selector 147, or by way of changing the operating temperature of wavelength selector 147.

Figure 2:
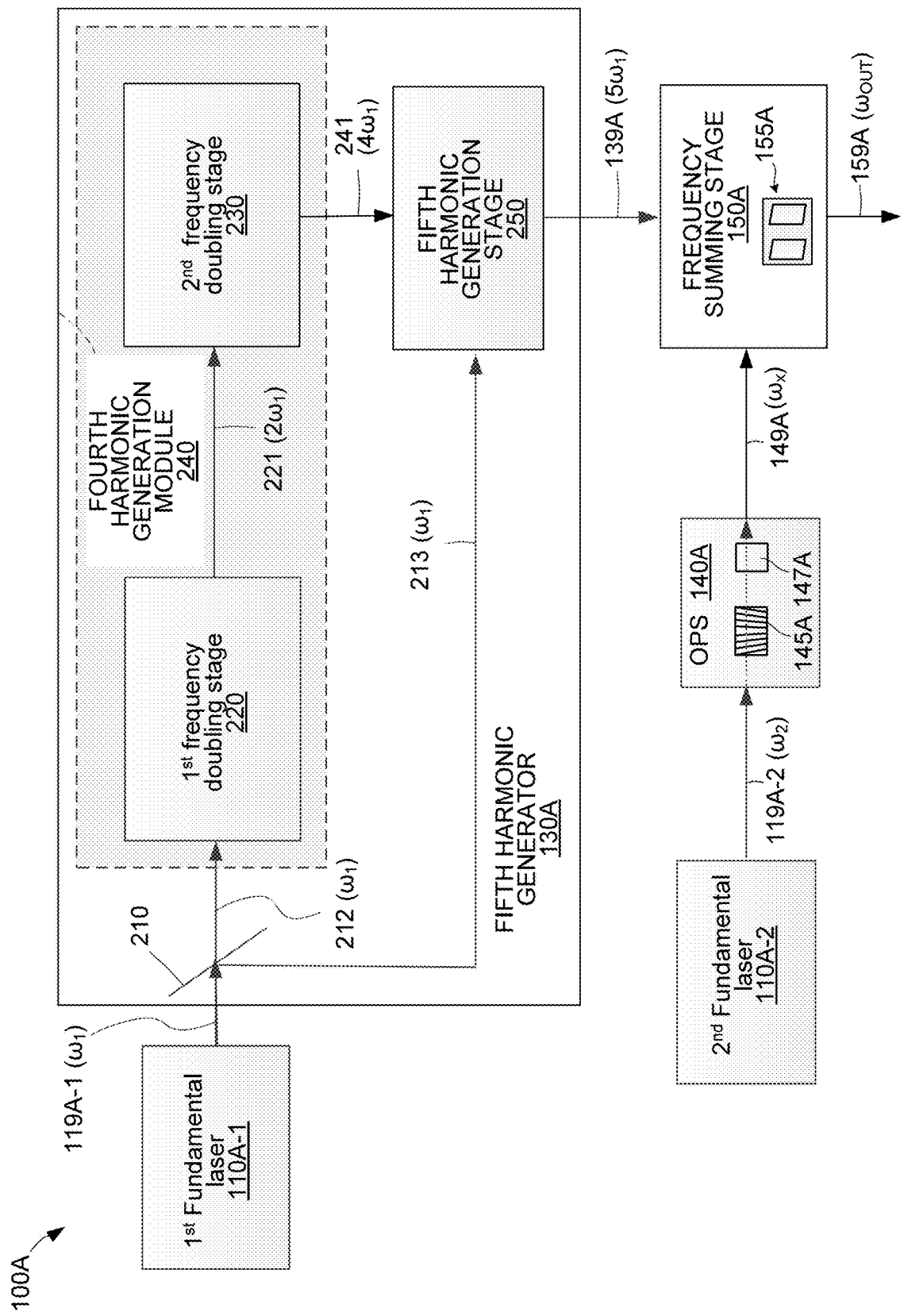
FIG. 2 is a block diagram showing a tunable laser assembly according to a specific exemplary embodiment of the present invention.

FIG. 2 is a simplified block diagram showing a tunable laser assembly 100A configured to generate DUV output light 159A according to a specific embodiment. Laser assembly 100A generally includes a first fundamental laser 110A-1, a second fundamental laser 110A-2, a fifth harmonic generator 130A, an optical parametric system (OPS) 140A, and a frequency summing stage 150A. Referring to the lower portion of FIG. 2, OPS 140A includes a fan-out PPNLC 145A and a wavelength selector 147A that are configured to receive and process second fundamental light 119A-2 in a manner consistent with that described above with reference to fan-out PPNLC 145 and wavelength selector 147 (FIG. 1). In alternative specific embodiments OPS 140A is implemented as either an optical parametric oscillator (OPO) or an optical parametric amplifier (OPA) that is configured to down-convert part of second fundamental light 119A-2 to a down-converted signal 149A having a down-converted frequency $\omega_x$ that is lower than second fundamental frequency $\omega_2$. Additional details related to specific embodiments OPS 140A are provided below with reference to three specific embodiments described with reference to FIGS. 3, 4 and 6. Referring to the lower right portion of FIG. 2, frequency summing stage 150A utilizes a nonlinear summing crystal set 155A to sum fifth harmonic light 139A received from fifth harmonic generator 150A and down-converted signal 149A received from OPS 140A to generate final output light 159A with an output frequency $\omega_{OUT}$ equal to the sum $5\omega_1+\omega_x$. Additional details of frequency summing stage 150A are described below with reference to FIGS. 5 and 6. Tunable laser assembly 100A also includes a frequency control system (not shown) that is configured and functions similar to frequency control system 160 described above with reference to FIG. 1, and as further described below with reference to FIGS. 3, 4, 5 and 6. In some preferred embodiments, first and second fundamental frequencies $\omega_1$ and $\omega_2$ have corresponding wavelengths of approximately 1064 nm, and OPS 140A is configured to generate down-converted signal 149A with a down-converted frequency $\omega_x$ having a corresponding wavelength between approximately 1350 nm and approximately 3300 nm, whereby laser assembly 100A generates laser output light 159A with output frequency $\omega_{OUT}$ having a wavelength in the range of approximately 184 nm to approximately 200 nm.

First and second fundamental lasers 110A-1 and 110A-2 are configured as described above with reference to FIG. 1 to generate fundamental light having a fundamental wavelength in the range of approximately 1000 nm to approximately 1100 nm (i.e., between about 1 μm and 1.1 μm). In one embodiment, first fundamental laser 110A-1 generates first fundamental light 119A-1 and second fundamental laser 110A-2 generates second fundamental light 119A-2 such that a first fundamental frequency $\omega_1$ of first fundamental light 119A-1 is substantially equal to a second fundamental frequency $\omega_2$ of second fundamental light 119A-2 (e.g., both first fundamental light 119A-1 and second fundamental light 119A-1 have a wavelength of approximately 1064 nm).

Referring to the upper portion of FIG. 2, fifth harmonic generator 130A is configured to receive first fundamental light 119A-1, and includes a beam splitter 210, two frequency doubling stages 220 and 230 that collectively form a fourth harmonic generation module 240, and a fifth harmonic generation stage 250. Beam splitter 210 is configured to split first fundamental light 119A-1 into a first fundamental part 212 and a second fundamental part 213, both parts having first fundamental frequency $\omega_1$. First frequency doubling stage 220 receives first fundamental part 212 and generates second harmonic light 221 with a second harmonic frequency $2\omega_1$ equal to twice the first fundamental frequency $\omega_1$. Second frequency doubling stage 230 receives second harmonic light 221 and generates fourth harmonic light 241 with a fourth harmonic frequency $4\omega_1$ equal to four times first fundamental frequency $\omega_1$. Fifth harmonic generation stage 250 is configured to receive and mix second fundamental part 213 and fourth harmonic light 241 to generate fifth harmonic light 251 at a fifth harmonic frequency $5\omega_1$ equal to five times first fundamental frequency $\omega_1$. In some embodiments tunable laser assembly 100A is configured as a CW laser assembly, and fifth harmonic generation stage 250 implements frequency mixing in a resonant cavity that is configured to circulate only second fundamental light portion 213 to enhance power. In other embodiments tunable laser assembly 100A is configured as a pulsed laser assembly, and fifth harmonic generation stage 250 generates fifth harmonic light by mixing fourth harmonic light 241 and a second fundamental light portion 213 without a resonant cavity.

In one specific embodiment in which tunable laser assembly 100A is implemented as a pulsed laser assembly, an unconsumed portion of fundamental light exiting first frequency doubling stage 220 may be separated out from second harmonic light 221 by a beam splitter or prism (not shown) and directed towards fifth harmonic generation stage 250 as second fundamental light portion 213. In one embodiment (not shown), unconsumed fundamental is not separated from the second harmonic 221 and co-propagates with second harmonic light 221 through second frequency doubling stage 230 to arrive at fifth harmonic generation stage 250 substantially coincident with fourth harmonic 241. One advantage of separating unconsumed fundamental from second harmonic light 221 is that an appropriate time delay can be applied either to unconsumed fundamental portion or to fourth harmonic light 241 so that the two laser pulses arrive at fifth harmonic generation stage 250 at substantially the same time. A further advantage is that optical elements such as mirrors, lens, and prisms (not shown) used for directing and/or focusing the light can be separately optimized in each path for the appropriate wavelength.

In some embodiments, each frequency doubling stage 220 and 230 may comprise an external resonant cavity including at least three optical mirrors and a nonlinear crystal arranged therein. The cavity can be stabilized with standard PDH (Pound-Drever-Hall), HC (Hänsch-Couillaud) or other locking techniques. The cavity length is adjusted to maintain resonance by adjusting the position of a mirror or prism through a control signal.

In a preferred embodiment, the first frequency doubling stage 220 includes a Lithium triborate (LBO) crystal, which can be substantially non-critically phase-matched (for an appropriate choice of crystal plane) at temperatures between room temperature and about 200° C. for producing a second harmonic in a wavelength range between about 515 nm and about 535 nm. In alternative embodiments, first frequency doubling stage 220 may include a Cesium Lithium Borate (CLBO) crystal or a beta-Barium Borate (BBO) crystal, either of which can be critically phase matched for generating a second harmonic in a wavelength range between about 515 nm and about 535 nm. In other alternative embodiments, first frequency doubling stage 220 may include a $KTiOPO_4$ (KTP), periodically-poled lithium niobate (PPLN), periodically-poled stoichiometric lithium tantalate (PPSLT), or other nonlinear crystal for frequency conversion. Second frequency doubling stage 230 may use critical phase matching in a CLBO, BBO or other nonlinear crystal. In preferred embodiments, the second frequency doubling stage 230 includes a hydrogen-treated or deuterium-treated CLBO crystal.

In one embodiment, at least one of fifth harmonic generator 130A and frequency summing stage 150A includes an annealed, hydrogen-treated or deuterium-treated cesium lithium borate (CLBO) crystal that is configured to be nearly non-critically phase matched for generating a wavelength in the range of approximately 184 nm to approximately 200 nm by mixing the fifth harmonic light 139A with the down-converted light 149A. Because of the near non-critical phase matching, the frequency mixing is very efficient (e.g. the nonlinear coefficient can be approximately, or slightly larger than, 1 pm $V^{-1}$) and the walk-off angle small (e.g. less than about 30 mrad). In a preferred embodiment, the annealed CLBO crystal is held at a constant temperature near 50° C. In another preferred embodiment, the annealed CLBO crystal for the fifth harmonic generator is held at a constant temperature that is approximately 80° C. or lower, and the annealed CLBO crystal for the frequency summing stage is held at a constant temperature that is approximately 30° C. or lower.

FIG. 3 illustrates an exemplary OPS 140A-1 configured to generate down-converted signal 149A-1 at down-converted frequency $\omega_x$ that is used to implement OPS 140A (FIG. 2) in cases where tunable laser assembly 100 or 100A is implemented as a pulsed laser assembly. OPS 140A-1 receives second fundamental light (second portion) 119A-2 from second fundamental laser 110A-2 (FIG. 2) and down-converts part of second fundamental light 119A-2 to generate down-converted signal 149A-1 having frequency $\omega_x$. OPS 140A-1 includes a focusing lens 301, a first focusing mirror 302, a fan-out PPNLC 145A-1, a second focusing mirror 303, a reflective-type grating (wavelength selector) 147A-1, and an output coupler 306 that are operably configured as shown to form an optical cavity in which light is reflected between grating 147A-1 and output coupler 306 by way of focusing mirrors 302 and 303, mirror 304 and fan-out PPNLC 145A-1. Second fundamental light 119A-2 is focused by a focusing lens 301 and enters OPS 140A-1 by way of passing through focusing mirror 302. Focusing lens 301 functions to focus fundamental light 119A-2 at a point near the center of fan-out PPNLC 145A-1. Fan-out PPNLC 145A-1 comprises any of the embodiments described above with reference to fan-out PPNLC 145 and is designed for quasi-phase matching for producing light at the signal frequency $\omega_x$ from second fundamental light at frequency $\omega_2$. Any residual second fundamental light 119A-2 that is not converted to signal frequency light by fan-out PPNLC 145A-1 passes through focusing mirror 303 and may be dumped. Focusing mirror 303 should preferably also transmit the idler frequency that is created in fan-out PPNLC 145A-1. In one embodiment, focusing mirror 303 is configured to be highly reflective for light at the signal frequency $\omega_x$, and arranged to direct light at the signal frequency created in, or passing through, fan-out PPNLC 145A-1 to output coupler 306 via reflection from mirror 304. Output coupler 306 transmits a first fraction of the light incident on it at the signal frequency $\omega_x$ (such as a fraction of approximately 20%) and reflects a second fraction of the light (such as approximately 80%). The second fraction of the light at signal frequency $\omega_x$ is reflected and directed by mirror 304 to focusing mirror 303, which redirects the light through fan-out PPNLC 145A-1 to focusing mirror 302, which in turn redirects the light to grating 147A-1. Grating 147A-1, which works as a wavelength selector, is configured using known techniques to be highly reflective for a selected range of frequencies centered on the desired signal frequency $\omega_x$. For example, grating 147A-1 may reflect a wavelength range of approximately 0.2 nm FWHM or of approximately 0.5 nm FWHM. Grating 147A-1 is important for determining the wavelength of the laser output 159A (see, e.g., FIG. 2) since the wavelength of the laser output 159A is the wavelength corresponding to the sum of the fifth harmonic of the fundamental and the signal frequency $\omega_x$. In one embodiment grating 147A-1 comprises a volume Bragg grating. In a preferred embodiment, grating 147A-1 is maintained at a constant temperature in order to ensure that its center wavelength remains constant. In one embodiment, the signal frequency $\omega_x$ and hence the wavelength of the laser output light is controlled by adjusting the temperature of grating 147A-1 to change the down-converted signal frequency $\omega_x$. In other embodiments grating 147A-1 comprises one of a distributed Bragg reflector and a Littrow grating. The signal frequency may be adjusted by rotating the grating 147A-1 so as to selected which wavelength is reflected back towards focusing mirror 302 and fan-out PPLN 145A-1.

Down-converted light at the signal frequency $\omega_x$, after reflection from grating 147A-1, returns to focusing mirror 302, which directs it back to fan-out PPNLC 145A-1. The optical path length followed by light at the signal frequency $\omega_x$ from fan-out PPNLC 145A-1 to focusing mirror 303 to output coupler 306, back to focusing mirror 303 through fan-out PPNLC 145A-1 to focusing mirror 302, to mirror 304, to grating 147A-1, back to focusing mirror 302, and back to fan-out PPNLC 145A-1 should be such that each pulse of light at signal frequency $\omega_1$ arrives back at fan-out PPNLC 145A-1 substantially simultaneously with a pulse of input laser light 119A-2. This arrangement is used to ensure that pulses of the input laser light 119A-2 and light at the signal frequency substantially co-propagate through fan-out PPNLC 145A-1 to enable stimulated down-conversion of input laser light to light at down-converted frequency $\omega_x$. In a preferred embodiment the optical path length should be such that the mismatch in the arrival times of pulses of light at the signal frequency $\omega_x$ with pulses of the input laser light 119A-2 is less than about 10% of a width of a pulse of the input laser light 119A-2.

In one embodiment, focusing mirrors 302 and 303 are configured to include focal lengths set such that pulses of light at the down-converted frequency arrive back at non-linear crystal 310, after the complete round trip just described, focused near the center of fan-out PPNLC 145A-1 and substantially spatially overlapped with pulses of the input laser light 119A-2. In alternative embodiments, grating 147A-1 and/or output coupler 306 may focus light at down-converted frequency $\omega_x$ instead of, or in addition to, focusing mirrors 302 and 303. In another embodiment, one or more lenses may be used to refocus the down-converted frequency instead of, or in addition to, focusing mirrors.

Note also that the relative locations of output coupler 306 and grating 305 could be swapped, as long as appropriate layout changes are made to incorporate additional mirrors and/or prisms to redirect light at down-converted frequency $\omega_x$. The layout shown in FIG. 3 is intended to be illustrative to explain the principles of operation.

In one embodiment, one or more controllers 161A-1 are utilized to control the positions, orientations and/or temperatures of fan-out PPNLC 145A-1 and grating 147A-1 (e.g., by way of wavelength adjustments W1A-11 and W1A-12) to generate down-converted signal 149A-1 at a selected down-converted frequency $\omega_x$.

Figure 4:
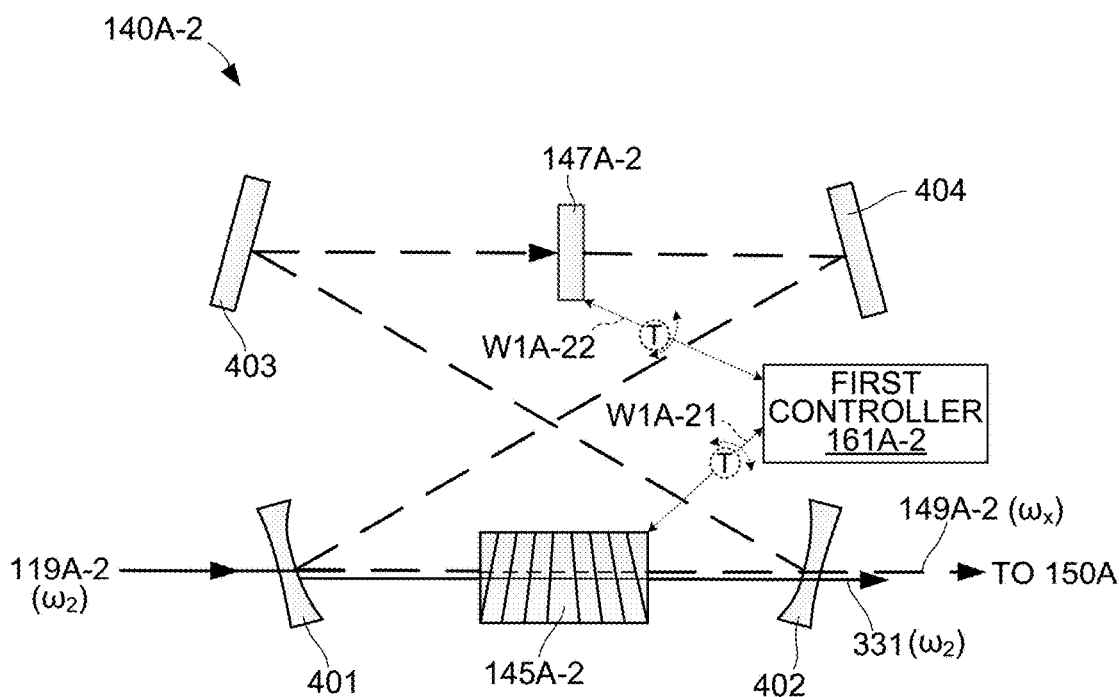
FIG. 4 is a simplified diagram showing an exemplary OPO/OPA configured to generate a down-converted signal used in a CW-laser version of the tunable assembly of FIG. 2 according to another exemplary embodiment of the present invention.

FIG. 4 illustrates an exemplary OPS 140A-2 configured to generate down-converted signal 149A-2 at down-converted frequency $\omega_x$ that is used to implement OPS 140A (FIG. 2) in cases where tunable laser assembly 100 or 100A is implemented as a CW laser assembly. OPS 140A-2 receives second fundamental light (second portion) 119A-2 from second fundamental laser 110A-2 (FIG. 2) and down-converts part of second fundamental light 119A-2 to a down-converted signal 145A-2 of frequency $\omega_x$. OPS 140A-2 includes a first focusing mirror 401, a fan-out PPNLC 145A-2, a second focusing mirror 402, a wavelength selector 147A-2, a third focusing mirror 403, and a fourth focusing mirror 404 that are operably configured as shown to form an optical cavity in which light is reflected between focusing mirrors 401, 402, 403 and 404 and transmitted through wavelength selector 147A-2 and fan-out PPNLC 145A-2. Second fundamental light 119A-2 enters OPS 140A-2 by way of passing through focusing mirror 401. Focusing or mode matching optics (not shown) may be placed in the light path of input laser light 119A-2 to focus input light 119A-2 at a point near the center of fan-out PPNLC 145A-2. Fan-out PPNLC 145A-2 comprises any of the embodiments described above with reference to fan-out PPNLC 145 and is designed for quasi-phase matching for producing light at the signal frequency $\omega_x$ from second fundamental light at frequency $\omega_2$. Any residual second fundamental light 119A-2 that is not converted to signal frequency light by fan-out PPNLC 145A-2 passes through focusing mirror 402 and may be dumped.

Wavelength selector 147A-2 is configured using known techniques to be highly transmissive for a narrow range of frequencies centered on the desired signal frequency $\omega_x$. Wavelength selector 147A-2 is important for determining the wavelength of the laser output 159A (see, e.g., FIG. 2) since the wavelength of the laser output 100A is the wavelength corresponding to the sum of the fifth harmonic of the fundamental and down-converted signal frequency $\omega_x$. In one embodiment wavelength selector 147A-2 comprises a transmissive grating. In another embodiment, wavelength selector 147A-2 comprises an etalon.

In an alternative embodiment, transmissive-type wavelength selector 147A-2 may be replaced with a reflective-type element that takes the place of one of the mirrors forming the cavity, such as mirror 403 or mirror 404. In this embodiment, the wavelength selector would be configured to reflect frequencies within a narrow range of frequencies centered on the desired signal frequency $\omega_x$. In this embodiment the wavelength selector may comprise a reflection grating, such as a reflection volume Bragg grating or a Littrow grating.

In an embodiment, wavelength selector 147A-2 is held at a constant temperature in order to ensure that its center wavelength remains constant. In one embodiment, adjustments to down-converted frequency $\omega_x$ can be made by adjusting the temperature of wavelength selector 147A-2 or by rotating the wavelength selector element.

Down-converted light 149A-2 at the signal frequency $\omega_x$ is first reflected by focusing mirror 402 and then by focusing mirror 403, passes through wavelength selector 147A-2, is reflected by focusing mirrors 404 and 401, and is directed back to fan-out PPNLC 145A-2. Down-converted light 149A-2 at the signal frequency $\omega_x$ exits OPS 140A-2 through mirror 402. Focusing mirrors 401, 402, 403 and 404 form a cavity that allows for the down-converted light to circulate and build up in power within the cavity. In another embodiment, one or more lenses may be used to refocus the signal frequency instead of, or in addition to, focusing mirrors.

In one embodiment, one or more controllers 161A-2 are utilized to control the positions, orientations and/or temperatures of fan-out PPNLC 145A-2 and grating 147A-2 (e.g., by way of wavelength adjustments W1A-21 and W1A-22) to generate down-converted signal 149A-2 at a selected down-converted frequency $\omega_x$.

In a manner similar to that explained above in reference to the frequency doubling cavities depicted in FIG. 2, known techniques may be used to adjust the length of the OPS cavity by moving, for example, mirror 403 or mirror 404, to maintain a resonant condition in the cavity for the circulating down-converted signal at frequency $\omega_x$.

Figure 5:
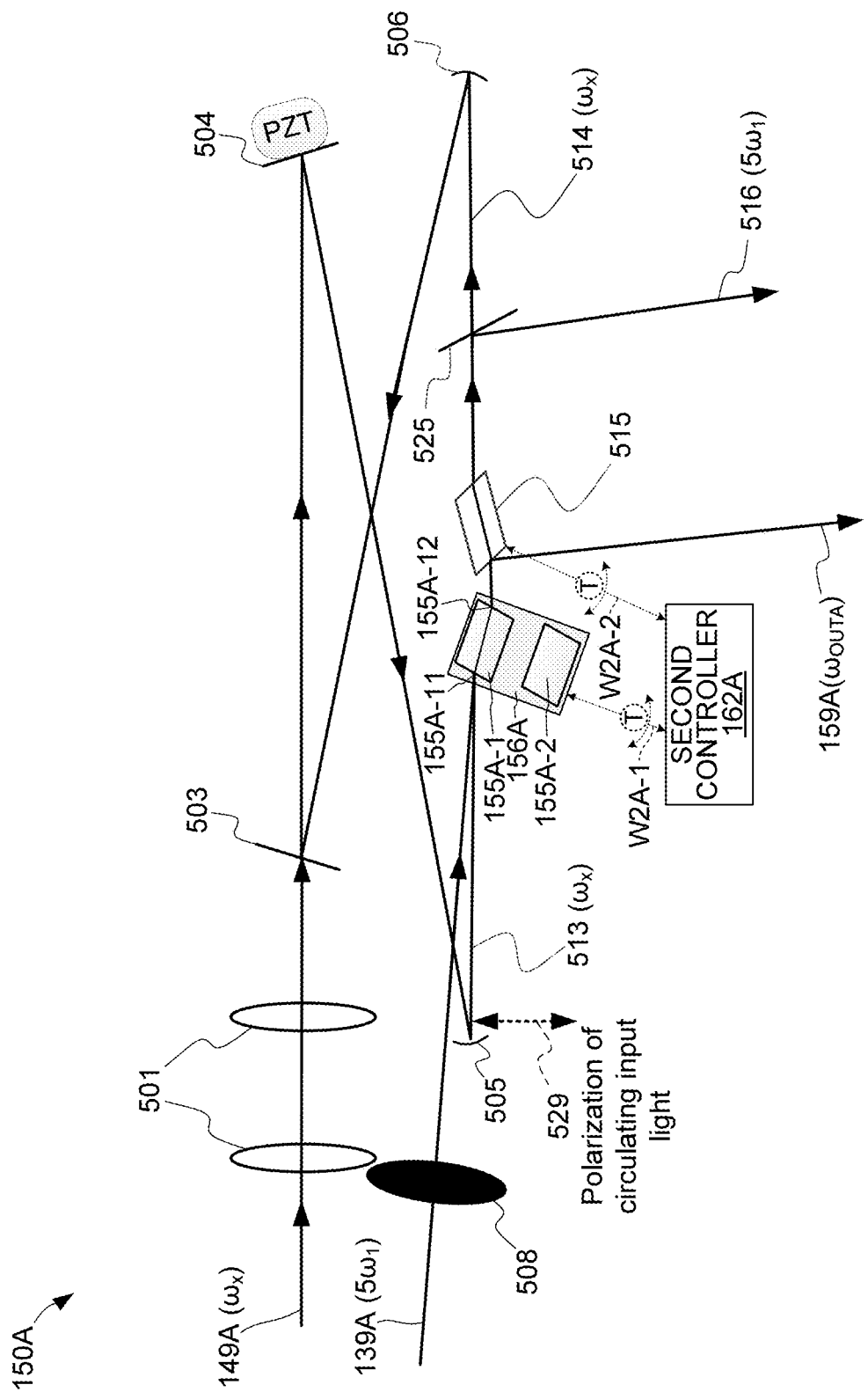
FIG. 5 is a simplified diagram showing an exemplary frequency summing stage utilized in the tunable assembly of FIG. 2 according to an exemplary embodiment of the present invention.

FIG. 5 is a simplified diagram showing an exemplary frequency summing stage 150A configured to generate DUV output light 159A at a selected output frequency $\omega_{OUT}$ and represents an exemplary embodiment that may be used in tunable laser assembly 100A (FIG. 2). Frequency summing stage 150A receives down-converted signal 149A from OPS 140A (e.g., either OPS 140A-1 shown in FIG. 3, or OPS 140A-2 shown in FIG. 4) and receives fifth harmonic light 139A from fifth harmonic generator 130A (FIG. 2). Frequency summing stage 150A includes a bow-tie ring cavity formed by several reflective-type optical elements including an input coupler 503, a flat mirror 504 and curved mirrors 505 and 506. Down-converted signal 149A enters this cavity through input coupler 503, is redirected by mirrors 504 and 505 such that it passes through a selected one of nonlinear summing crystal 155A-1 and 155A-2 (e.g., through input surface 155A-11 and an output surface 155A-12 of crystal 155A-1, as depicted in FIG. 5). Fifth harmonic light 139A enters the bow-tie ring cavity passing close to (but not through) mirror 505 and is directed through the selected one of nonlinear summing crystals 155A-1 and 155A-2 (e.g., through crystal 155A-1). Light exiting from the output surface 155A-12 of selected nonlinear summing crystal 155A-1 includes the selected DUV output light 159A at user-selected output frequency $\omega_{OUT}$, an unconsumed portion 514 of down-converted light 149A, and an unconsumed portion 516 of fifth harmonic light 139A. The output light 581 is reflected from the surface of beam splitter (BS) 515 and directed out of the cavity. DUV output light 159A exits the cavity after being reflected from a beam splitter (BS) 515, which is positioned between output surface 155A-12 and mirror 506. Unconsumed fifth harmonic light portion 516 is also directed out of the cavity, for example, by being reflected from a second beam splitter 525 positioned between beam splitter 515 and mirror 506. Beam splitters 515 and 525 are configured to pass unconsumed portion 514 of down-converted signal 149A such that it is recirculated to enhance the power of light at down-converted frequency $\omega_x$ within the cavity.

In one embodiment, one or more second controllers 162A are utilized to control the position, orientation and/or temperature of nonlinear summing crystals 155A-1 and 155A-2 (e.g., by way of wavelength adjustments W2A-1) to generate DUV output signal 159A at a selected DUV output frequency $\omega_{OUTA}$, and to control the position, orientation and/or temperature of BS 515 (e.g., by way of wavelength adjustments W2A-2) to direct DUV output signal 159A out of frequency summing stage 150A.

In some embodiments nonlinear summing crystals 155A-1 and 155A-2 comprise annealed (deuterium-treated or hydrogen-treated) cesium lithium borate (CLBO) crystals that are maintained (e.g., by second controller 162) at a constant temperature T of approximately 30° C. or lower by way of a suitable temperature control system (e.g., a thermoelectric cooler). In one embodiment, the temperature of nonlinear summing crystals 155A-1 and 155A-2 may be lower than 0° C., for example, approximately −5° C. or −10° C. For type-I matching in CLBO at a temperature of approximately 30° C. with a second fundamental or signal wavelength near 1342 nm and a fifth harmonic having a wavelength near 209.4 nm, the phase-matching angle is approximately 79°. For type-I matching in CLBO at a temperature of approximately 30° C. with a second fundamental wavelength near 1300 nm and a fifth harmonic having a wavelength near 213 nm, the phase matching angle is approximately 81°. Both of these examples show that nearly non-critical phase matching with high efficiency and low walk-off can be achieved for generating wavelengths in the range of approximately 184 nm to approximately 200 nm. These wavelength combinations are merely examples and are not meant to limit the scope of the invention. One skilled in the appropriate arts understands how to choose different combinations of wavelengths, temperature, and angle to achieve phase matching.

In one embodiment, BS 515 may comprise a strontium tetraborate (SBO) crystal, SBO glass or a $CaF_2$ crystal. Since SBO has good deep UV transmission and has a high damage threshold, SBO may advantageously be used as a substrate material for the BS 515 to ensure long life in spite of the high-power level of the unconsumed down-converted light 514 circulating in the cavity. If 515 comprises an SBO crystal, its thickness and/or the orientation of its crystal c axis may be configured so as to minimize any frequency doubling of the unconsumed down-converted light 514 passing through it. BS 515 may comprise a polarizing beam splitter, a dichroic beam splitter, prism, or other component to separate the wavelengths. In one embodiment, BS 515 has its surfaces oriented so that the unconsumed down-converted light 514 is substantially p-polarized relative to those surfaces and the surfaces are at approximately Brewster's angle relative to that unconsumed input light.

In another embodiment, BS 515 may be further configured to reflect both DUV output light 159A and unconsumed fifth harmonic light portion 516 out of the cavity, and second beam splitter 525 may be omitted.

In one embodiment, down-converted light 149A ($\omega_x$) is focused by one or more lenses 501 before entering the cavity to match the intrinsic mode of the resonant cavity that has a beam waist inside or proximate to the selected nonlinear summing crystal 155A-1. In an alternative embodiment, input surface 155A-11 of nonlinear summing crystal 155A-1 may be coated with an appropriate anti-reflection coating instead of orienting the input surface 155A-11 and output surface 155A-12 at Brewster's angle.

Although FIG. 5 depicts the cavity of final frequency summing stage 150A as being formed by two flat mirrors and two curved mirrors, other combinations of mirrors and/or lenses may be used to refocus the down-converted light circulating in the cavity. In an alternative embodiment, a final frequency summing stage may comprise a delta cavity, a standing-wave cavity, or other shaped cavity instead of a bow-tie cavity. Any of these cavities can be stabilized with standard PDH or HC locking techniques. The cavity length is adjusted to maintain resonance by adjusting the position of one of the mirrors (such as mirror 504 in FIG. 5) or the position of a prism, through a control signal (not shown) connected to a piezo-electric transducer (PZT), voice coil or other actuator.

In case of a pulsed laser assembly, the mixing of the down-converted signal 149A with fifth harmonic light 139A can be implemented without a cavity by removing the mirrors 504, 505 and 506. Nonlinear summing crystals 155A-1 and 155A-2 are selectively positioned to alternatively receive both fifth harmonic light 139A (i.e., from fifth harmonic generation generator 150A, FIG. 2) and down-converted signal 149A (from OPO 140A, FIG. 2) such that both enter nonlinear summing crystal 155A-1 approximately collinearly and are focused to corresponding beam waists disposed inside or proximate to nonlinear summing crystal 155A-1 (beam waists not shown).

Figure 6:
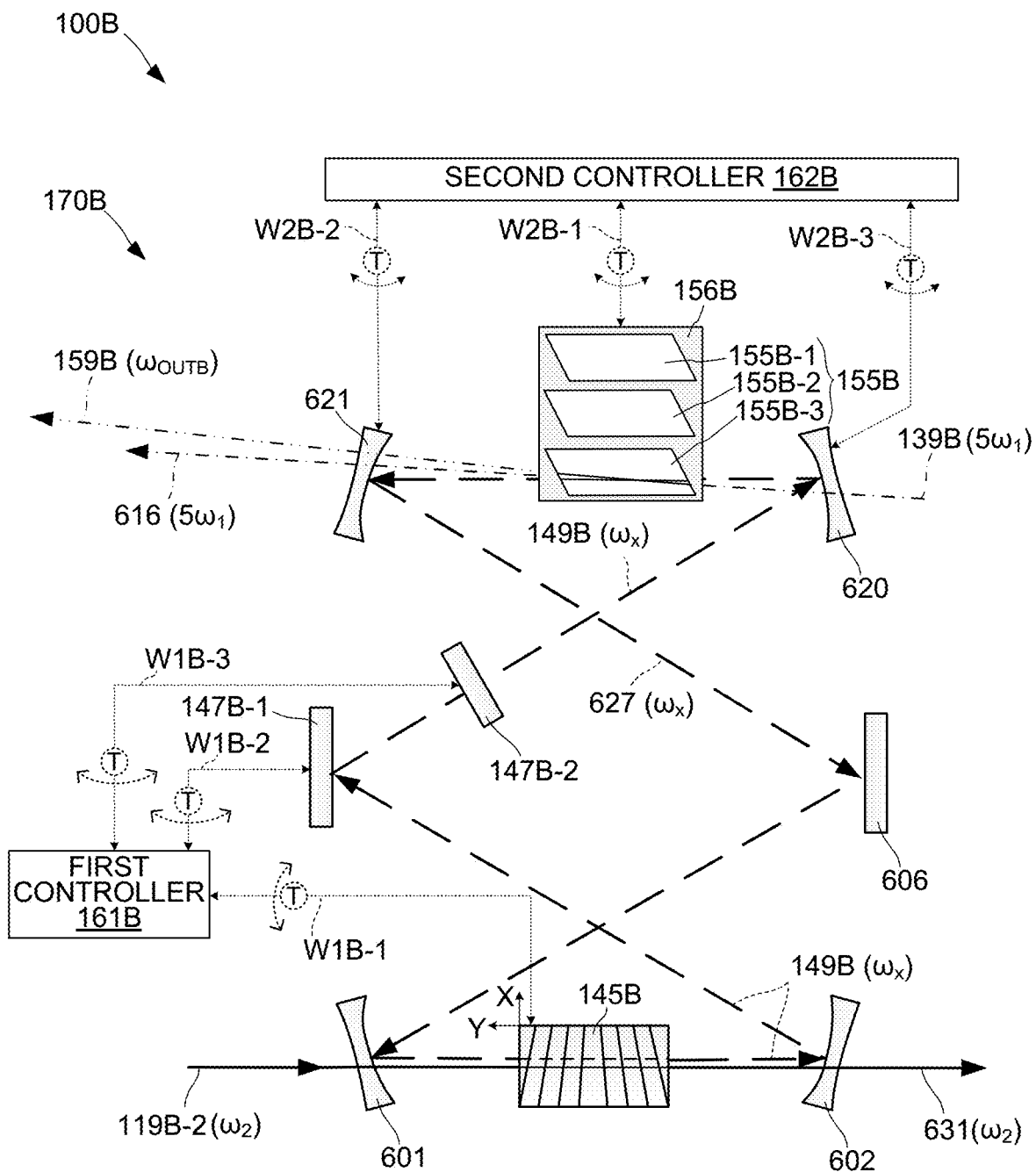
FIG. 6 is a simplified diagram showing a partial tunable laser assembly according to an alternative embodiment in which a fan-out PPNLC and a nonlinear summing crystal set are included in a single cavity arrangement.

FIG. 6 depicts a portion of a tunable laser assembly 100B according to another embodiment in which a fan-out PPNLC 145B and a nonlinear summing crystal set 155B are included in a single cavity arrangement 170B that is configured to selectively circulate light at down-converted frequency $\omega_x$ through both fan-out PPNLC 145B and through the summing crystal set 155B. That is, in contrast to the two separate cavities utilized by OPS 145A and frequency summing stage 150A of assembly 100A (FIG. 2), unconsumed down-converted light 627 exiting nonlinear summing crystal set 155B is circulated (returned) to fan-out PPNLC 145B, whereby it is amplified to generate down-converted signal 149B and directed to nonlinear summing crystal set 155B by the various mirrors and optical elements forming single cavity arrangement 170B. In addition to single cavity arrangement 170B, tunable laser assembly 100B includes one or more fundamental lasers (not shown) and a fifth harmonic generator (not shown) that supply fundamental light 119B and fifth harmonic light 139B to cavity arrangement 170B in a manner similar to that described above with reference to FIGS. 1 and 2. Other than operating within a single cavity as described below, fan-out PPNLC 145B is configured and functions substantially as described with reference to the embodiments mentioned above. Nonlinear summing crystal set 155B differs from the embodiments mentioned above in that it includes three nonlinear summing crystals 155B-1, 155B-2 and 155B-3 that are selectively positioned in the light path generated by single cavity arrangement 170B as described below with reference to FIGS. 7A to 7D, but otherwise functions in a manner similar to sets 155 and 155A respectively described above with reference to FIGS. 1 and 2.

In the exemplary embodiment shown in FIG. 6, single cavity arrangement (cavity) 170B is formed by mirrors 601, 602, 606 and 620, a reflective element mirror (i.e., mirror or wavelength selector) 147B-1 and output coupler/mirror 621 that are configured to direct light having down-converted frequency $\omega_x$ along an optical path having two laser beam waists, one occurring inside PPNLC 145B, the other occurring inside one of nonlinear summing crystals 155B-1, 155B-2 and 155B-3 (e.g., inside nonlinear summing crystal 155B-3 as depicted in FIG. 6). Referring to the lower portion of FIG. 6, fundamental light 119B-2 at fundamental frequency $\omega_2$ is directed through mirror 601 and focused inside fan-out PPLOC 145B to generate light at down-converted signal frequency $\omega_x$. First mirror 601 is also configured to reflect unconsumed down-converted light 627 received from mirror 606 such that it forms a beam waist inside PPNLC 145B. To facilitate the entry of fundamental light 119B-2 into cavity 170B through mirror 601 (as depicted), mirror 601 may be configured to transmit or pass fundamental light 119B-2 while reflecting recirculated signal light 627 at down-converted frequency $\omega_x$ (for example, by providing mirror 601 with a coating that transmits light having a frequency close to fundamental frequency $\omega_2$ while reflecting light having a frequency close to down-converted frequency $\omega_x$). In an alternative embodiment, fundamental light 119B-2 could be injected into cavity 170B through another mirror, such as mirror 606, in which case mirror 601 should be configured to reflect both the fundamental light 119B-2 and recirculated signal light 627. In one embodiment mirror 602 is configured to selectively reflect down-converted signal 149B and configured to allow residual fundamental light 631 having fundamental frequency $\omega_2$ (i.e., fundamental light not consumed by the generation of down-converted light 149B) to pass out of cavity 170B. The down-converted light 149B is directed from mirror 602 to reflective element reflective-type grating/mirror 147B-1, which redirects down-converted light 149B toward mirror 620. Mirror 620 is configured to redirect the down-converted light 149B received from mirror 147B-1 through one of nonlinear summing crystals 155B-1, 155B-2 and 155B-3. Mirror 621 is configured to reflect unconsumed down-converted light 627 exiting nonlinear summing crystals 155B-1 to 155B-3, and mirror 606 is configured to receive and reflect this unconsumed down-converted light 627 to mirror 601. Although cavity 170B is depicted as comprising six mirrors, more or fewer mirrors may be used. When tunable laser assembly 100B is configured as a CW laser, it is preferable to keep the cavity length short, so only curved mirrors such as 601, 602, 620 and 621 may be used. When tunable laser assembly 100B is configured as a pulsed laser, the cavity length needs to match the spacing between pulses (or an integer fraction or multiple of that length) and so the cavity needs to be big (for example, a cavity length of 3.747 m or 1.874 m if the laser repetition rate is 80 MHz). Such a cavity may use six or more mirrors in order to fit into a convenient footprint. A CW cavity may be configured as a single mode cavity (which would generate a very narrow bandwidth signal) or as a multi-mode cavity (such as a few modes or as many as a few hundred modes). In general, a multi-mode cavity is more stable than a single mode cavity, but the bandwidth of signal lights 149B and 627 will be greater. For use in a semiconductor inspection system, generally large numbers of modes (as about 100 or more), or a high-repetition-rate pulsed laser would be preferred.

In one embodiment the down-converted frequency $\omega_x$ of signal light 149B leaving fan-out PPLOC 145B is determined by quasi-phase matching (QPM) due to the poling length of the section of fan-out PPLOC 145B through which fundamental light 119B-2 and recirculated signal light 627 pass. As discussed above, the section (region) of fan-out PPLOC 145B through which down-converted light passes is selectively adjusted by controller 161B by way of wavelength adjustment W1B-1 (e.g., translating the nonlinear crystal 145B in the +X-axis and −X-axis directions indicated in FIG. 6) in combination with wavelength selection by wavelength selector 147B-2 and/or reflective element 147B-1. Typically, only one of reflective element 147B-1 and wavelength selector 147B-2 is configured for wavelength selection (i.e., when transmissive-type wavelength selector 147B-2 is used, then reflective element 147B-1 may be implemented using a mirror; conversely, when reflective element 147B-1 is implemented as a wavelength selector, for example, using a reflective-type grating, wavelength selector 147B-2 may be omitted). Wavelength selector 147B-2 may comprise one of an etalon (Fabry-Perot interferometer) and a transmissive-type grating (such as a volume Bragg grating or ruled grating). Reflective element 147B-1, when implemented as a wavelength selector, may be adjusted by controller 161B by way of wavelength adjustments W1B-2 such that the grating is rotated (as depicted by the dotted arrows) to direct the desired wavelength towards mirror 620 or, in the case of a volume Bragg grating, by adjusting its temperature T. When reflective element 147B-1 is a mirror, wavelength selector 147B-2 may be adjusted by controller 161B by way of wavelength adjustment W1B-3 (e.g., by rotating as indicated by the arrow and/or by adjusting the operating temperature T). In either case, reflective element 147B-1 and/or wavelength selector 147B-2 direct light having the desired signal frequency $\omega_x$ to mirror 620, and undesired wavelengths, including the idler frequency, may be directed out of the cavity, absorbed, or otherwise blocked by elements 147B-1 and/or 147B-2. Furthermore, one or more of the mirrors in the cavity may be configured to transmit the idler frequency with high efficiency (such as about 90% or higher efficiency) while reflecting the signal light 149B with high efficiency, such that after reflecting off multiple mirrors, substantially all of the idler frequency leaves the cavity.

Similar to the fan-out PPNLC elements described above, fan-out PPNLC 145B is poled in a fan-out configuration to have a range of poling periods spanning a desired signal frequency range. Suitable fan-out PPNLC elements are available commercially from, for example, HC Photonics (Hsinchu, Taiwan). When input light 119B-2 has a wavelength close to 1064.5 nm a signal frequency range corresponding to signal wavelengths between 1356 and 2129 nm requires QPM poling periods between 25.86 µm and 32.15 µm when fan-out PPNLC 145B comprises a MgO-doped lithium niobate crystal, and QPM poling periods between 25.66 µm and 32.32 µm when fan-out PPNLC 145B comprises a stoichiometric lithium titanate crystal. Note that these crystal materials have strong absorption of wavelengths longer than about 4 µm, so these materials may not be useful for signal frequencies corresponding to signal wavelengths shorter than about 1450 nm since the idler will have a corresponding wavelength longer than 4 µm and the heat dissipated in fan-out PPNLC 145B may degrade the phase matching and/or may cause thermal lensing.

Cavity 170B is further configured such that down-converted signal light 149B and fifth harmonic light 139B are directed along a summing light path through nonlinear summing crystal set 155B to create DUV output light 159B having output frequency $\omega_{OUTB}$. In the exemplary embodiment depicted in FIG. 6, fifth harmonic light 139B enters cavity 170B by passing through or just outside the edge of mirror 620. Fifth harmonic light 139B travels at a slight angle (such as an angle less than 5°) relative to signal light 149B such that fifth harmonic light 139B and signal light 149B cross near the center of a selected nonlinear summing crystal (e.g., crystal 155B-3, as depicted in FIG. 6). Laser output light 159B at the desired output frequency $\omega_{OUTB}$ and unconsumed fifth harmonic light 616 exit cavity 170B by passing by, or through, mirror/output coupler 621.

In order for tunable laser assembly 100B to generate output light over a wide range of wavelengths, such as a wavelength range between about 193 nm and about 184 nm, it may be necessary to provide nonlinear summing crystal set 155B with more than two nonlinear summing crystals since the required angle adjustment range may be as large as 25°. If a single nonlinear summing crystal is rotated by such a large angle, reflection losses may prevent the generation of laser output light having the required power. Furthermore, the displacement of the unconsumed down-converted light 627 by the nonlinear summing crystal when rotated through such a large angle may be too big to be compensated for by adjusting one or more of the mirrors forming cavity 170B. Accordingly, in one embodiment, nonlinear summing crystal set 155B includes three nonlinear summing crystals 159B-1 to 159B-3, where each of these crystals is fabricated (cut) such that its different crystal axis forms a corresponding different angle relative to the summing light propagation direction in order to phase match over a different range of signal and output frequencies (i.e., similar to that described above with reference to FIG. 1). To facilitate moving/positioning the most appropriate nonlinear summing crystal 159B-1, 159B-2 or 159B-3 into the summing light path to generate DUV output light at a user's selected wavelength, nonlinear summing crystals 159B-1 to 159B-3 are fixedly mounted on a frame 156B (e.g., an X-Y-θ table, a linear stage or another suitable mechanism) that is controlled by second controller 162B (i.e., by way of wavelength adjustment W2B-1), for example, in the manner described below with reference to FIGS. 7A to 7D. Frame 156B should be temperature controlled and rotatable to effect optimization of the phase matching condition for frequency summation. In other embodiments, two, four or more nonlinear summing crystals may be utilized.

Referring to the upper portion of FIG. 6, nonlinear summing crystal set 155B includes three nonlinear crystals 155B-1, 155B-2 and 155B-3 that are alternatively positioned (moved) into the substantially coincident light path formed by converted signal light 149B and fifth harmonic light 139B. Second controller 162B forms another portion of the frequency control system of tunable laser assembly 100B. In one embodiment, nonlinear summing crystals 155B-1 to 155B-3 are maintained in a fixed relationship by way of being fixedly mounted on an X-Y-θ table (frame) 156B whose operations are controlled by controller 162B by way of wavelength adjustment W2B-1.

FIGS. 7A to 7D depict a portion of tunable laser assembly 100B when configured in four different operating states (i.e., at four different time periods). As described above with reference to FIG. 1, the four different operating states correspond to four different user-supplied output frequency control signal values that are submitted to frequency control system of tunable laser assembly 100B prior to each of the depicted operating states. For descriptive purposes, FIGS. 7A to 7D depict the portion of tunable laser assembly 100B including mirrors 620 and 621 and nonlinear summing crystals 155B-1 to 155B-3. Although not shown in FIGS. 7A to 7D, it is understood that the frequency control system controls the depicted movement of nonlinear summing crystals 155B-1 to 155B-3 by way of controller 162B, and also controls the transmission of light through fan-out PPNLC 145B (FIG. 6) by way of controller 161B such that different down-converted light frequencies are directed through the selected nonlinear summing crystal 155B-1 to 155B-3.

Figure 7A:
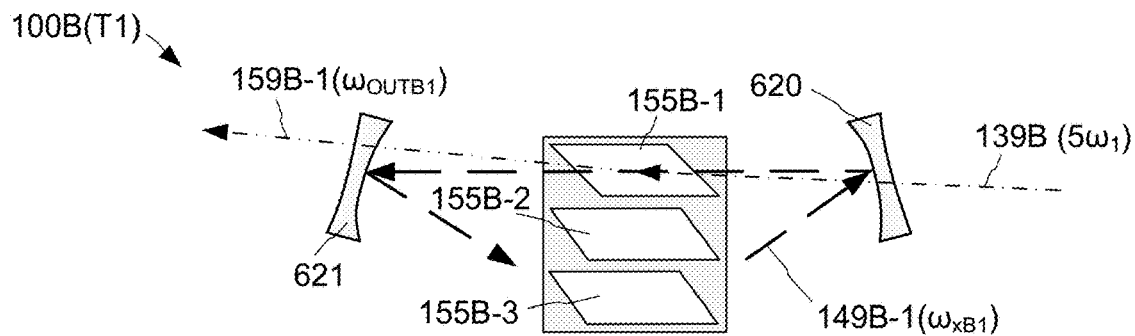
FIGS. 7A, 7B, 7C and 7D are simplified diagrams depicting a portion of tunable laser assembly of FIG. 6 during various operating states.
Figure 7B:
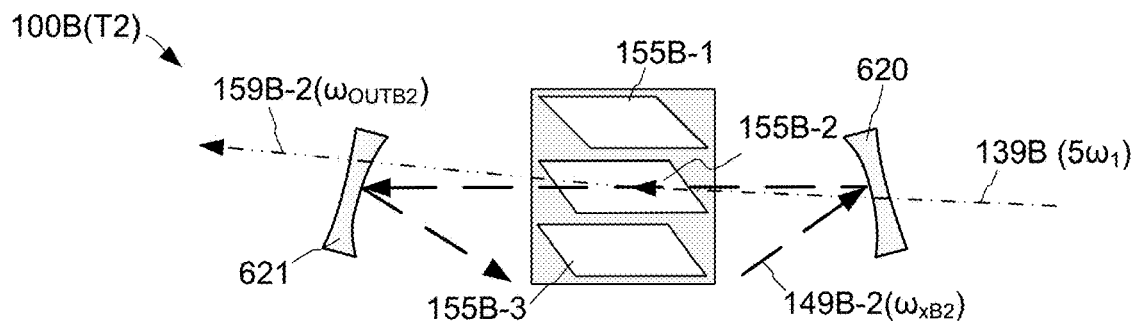
Figure 7C:
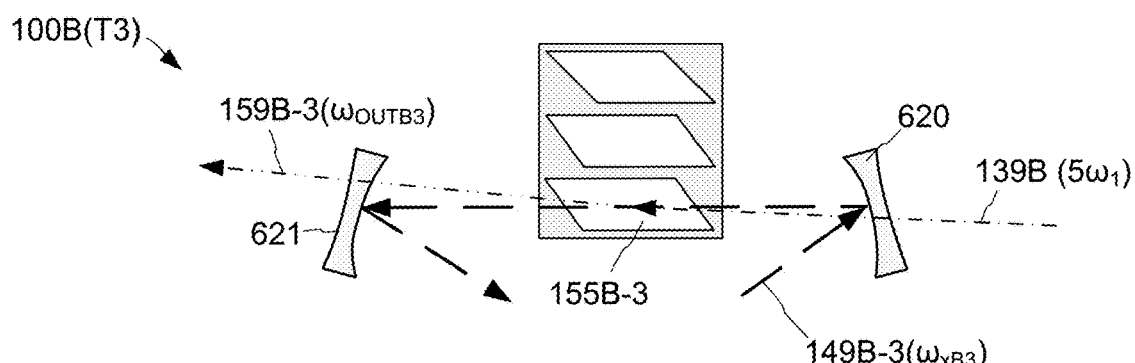

FIGS. 7A, 7B and 7C depict exemplary operating states that may be utilized in response to significantly different user-selected output frequencies. For example, as indicated in FIG. 7A, during a first time period T1 (e.g., in response to a first output frequency value OF=1), the frequency control system causes fundamental light portion 119B-2 to pass through a first region of fan-out PPNLC 145B, thereby generating a first down-converted signal 149B-1 having a first down-converted frequency $\omega_{xB1}$ that, when subsequently summed with fifth harmonic light 139B in selected nonlinear summing crystal 155B-1, causes tunable laser assembly 100 to generate DUV output light 159B-1 having a first user-selected output wavelength $\omega_{OUTB1}$. Similarly, as indicated in FIG. 7B, during a second time period T2 (e.g., in response to a second output frequency value OF=2), the frequency control system causes fundamental light portion 119B-2 to pass through a second region of fan-out PPNLC 145B, thereby producing down-converted light 149B-2 with a corresponding down-converted frequency $\omega_{xB2}$ such that, when summed with fifth harmonic light 139B in selected nonlinear summing crystal 155B-2, tunable laser assembly 100 generates DUV output light 159B-2 having a second user-selected output wavelength $\omega_{OUTB2}$. Finally, as indicated in FIG. 7C, during a third time period T3 (e.g., in response to a third output frequency value OF=3), the frequency control system causes fundamental light portion 119B-2 to pass through a third region of fan-out PPNLC 145B, thereby producing down-converted light 149B-3 with a corresponding down-converted frequency $\omega_{xB3}$ such that, when summed with fifth harmonic light 139B in selected nonlinear summing crystal 155B-3, tunable laser assembly 100B generates DUV output light 159B-3 having a third user-selected output wavelength $\omega_{OUTB3}$.

Figure 7D:
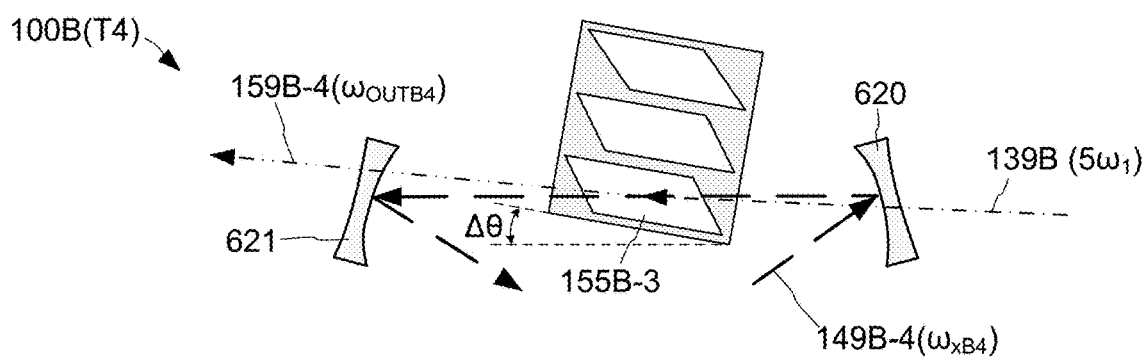

FIG. 7D depicts tunable laser assembly 100B in an exemplary fourth operating state (e.g., in response to a fourth output frequency value OF=4) that may be utilized in response to a user-selected output frequency that differs by a relatively small amount from DUV output frequency $\omega_{OUTB3}$ (FIG. 7C). As in the previous examples, during the fourth time period T4 the frequency control system causes fundamental light portion 119B-2 to pass through a corresponding fourth region of fan-out PPNLC 145B, thereby producing down-converted light 149B-4 with a corresponding down-converted frequency $\omega_{xB4}$ that differs by a relatively small amount from down-converted frequency $\omega_{xB3}$. In addition, the frequency control system rotates selected nonlinear summing crystal 155B-3 by an angle $\Delta\theta$ so as to achieve phase matching between the input frequencies $\omega_{xB4}$ and $5\omega_1$ and the output frequency $\omega_{OUTB4}$ by changing the angle between the axes of the selected nonlinear summing crystal 155B-3 and the light propagation direction down-converted light 149B-4 (i.e., in comparison to the phase matching angle achieved in FIG. 7C). With these operating condition changes, tunable laser assembly 100B generates DUV output light 159B 4 having a fourth user-selected output wavelength $\omega_{OUTB4}$ that differs a relatively small amount from third user-selected output wavelength $\omega_{OUTB3}$. In some embodiments the temperature of nonlinear summing crystal 155B-3 is controlled (for example by a heater, not shown) to maintain the best phase matching condition. In a preferred embodiment nonlinear summing crystal 155B-3 may be adjusted by both rotating the crystal and performing a temperature adjustment to maintain phase matching. When the signal frequency is adjusted, a corresponding adjustment in the temperature and/or angle of the nonlinear summing crystal may be made. When the nonlinear summing crystal is rotated, the direction in which DUV output light 159B-4 leaves the cavity will change. Downstream optics (not depicted) may be provided that can be adjusted to compensate for this change. Nonlinear summing crystals 155B-1 to 155B-3 preferably have input and output faces oriented close to Brewster's angle relative to the summing light propagation direction in order to minimize reflection losses. Adjustments in the orientation of the summing crystals by small angles (such as by ±5°) do not cause significant reflection losses as the down-converted signal light and the fifth harmonic light stay close to Brewster's angle.

Since adjusting one or more of components such as fan-out PPNLC 145B, gratings 147B-1 and 147B-2 and nonlinear summing crystals 155B-1 to 155B-3 may cause a small displacement or change in direction of recirculated signal light 627, one or more of the other cavity mirrors (or another optical compensator included in the cavity, not depicted) may be selectively adjusted by the assembly's control system (e.g., using controller 161B or 162B) to maintain good alignment of recirculated signal light 627 within cavity 170B. When cavity 170B is configured as a CW cavity, one of the mirrors or other cavity components may be adjusted by a suitable controller (e.g., a piezoelectric transducer or voice coil) to achieve and maintain a desired cavity length using known cavity locking techniques.

Table 1 (provided below) shows exemplary wavelengths and phase matching angles for an embodiment in which laser assembly 100B is implemented using three CLBO crystals to facilitate the generation of laser output light having an output wavelength range from 184.8 nm to 193.5 nm. In this example, the first CLBO crystal, which would be used to implement nonlinear summing crystal 155B-1, would be cut with the axis at an angle of 68.4° to the light propagation direction, the second CLBO crystal implementing nonlinear summing crystal 155B-2 would be cut with the axis at an angle of 61.1°, and the third CLBO crystal implementing nonlinear summing crystal 155B-3 would be cut with the axis at an angle of 54.4°. The table also includes examples of the shortest and longest laser output wavelengths that each CLBO crystal might be used to produce using a fifth harmonic of 212.9 nm. Each crystal would need to be adjusted as described above with reference to FIG. 7D over a less than ±4° range from nominal to accommodate different output wavelengths. If each crystal were cut so that its input and output surfaces were at Brewster's angle for its nominal wavelengths, rotating less than 4° from nominal to accommodate different wavelengths would cause only a minor increase in reflectance and, hence, cavity losses.

TABLE 1

CLBO Summing Crystal Phase Matching Angles

| NONLINEAR SUMMING CRYSTAL | WAVELENGTHS $5\omega_1 + \omega_{xB} \rightarrow \omega_{OUTB}$ | PHASE MATCHING ANGLE |
|---|---|---|
| 155B-1 | 212.9 nm + 1400 nm -> 184.8 nm | $\theta$ = 72.1° |
| 155B-1 | 212.9 nm + 1465 nm -> 185.9 nm | $\theta$ = 68.4° |
| 155B-1 | 212.9 nm + 1545 nm -> 187.1 nm | $\theta$ = 64.8° |
| 155B-2 | 212.9 nm + 1550 nm -> 187.2 nm | $\theta$ = 64.6° |
| 155B-2 | 212.9 nm + 1650 nm -> 188.6 nm | $\theta$ = 61.1° |
| 155B-2 | 212.9 nm + 1750 nm -> 189.8 nm | $\theta$ = 58.3° |
| 155B-3 | 212.9 nm + 1760 nm -> 189.9 nm | $\theta$ = 58.0° |
| 155B-3 | 212.9 nm + 1920 nm -> 191.6 nm | $\theta$ = 54.4° |
| 155B-3 | 212.9 nm + 2129 nm -> 193.5 nm | $\theta$ = 50.7° |

Another aspect of the invention is a wafer, reticle or photomask inspection or metrology system that incorporates at least one of the inventive lasers with output wavelengths in the range of approximately 184 nm to approximately 200 nm. Aspects of such systems are illustrated in FIGS. 8, 9 and 10.

Figure 8:
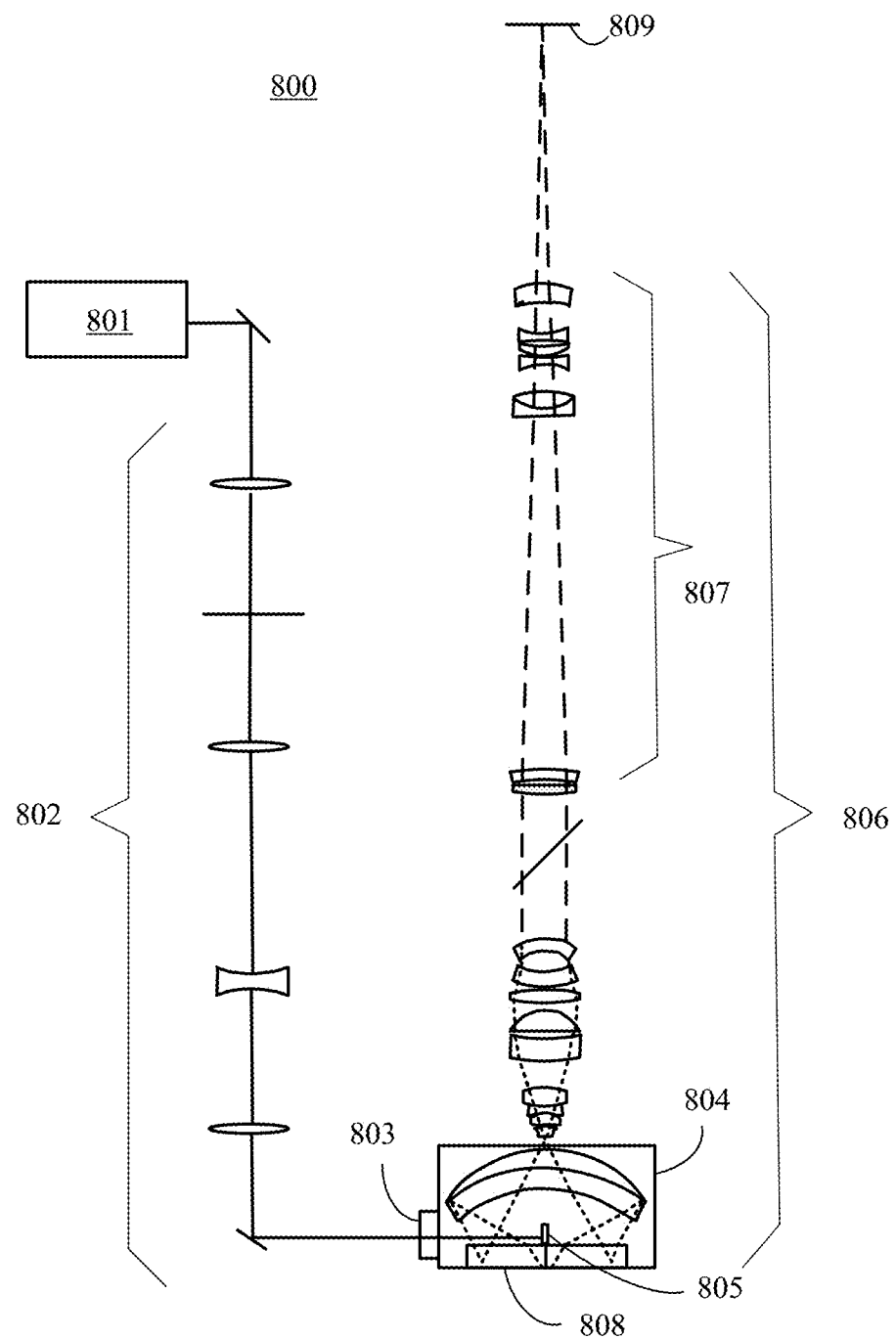
FIG. 8 is a simplified diagram showing an exemplary inspection system with dark-field and bright field inspection modes that utilizes one of the laser assemblies described herein in accordance with another specific embodiment of the present invention.

This laser may be used in an inspection system with dark-field and bright-field inspection modes as shown in FIG. 8. This figure and the system are explained in U.S. Pat. No. 7,817,260 to Chuang et al., which is incorporated by reference as if fully set forth herein. FIG. 8 illustrates a catadioptric imaging system 800 incorporating normal incidence laser illumination. The illumination block of system 800 includes a laser 801, adaptation optics 802 to control the illumination beam size and profile on the surface being inspected, an aperture and window 803 in a mechanical housing 804, and a prism 805 to redirect the laser along the optical axis at normal incidence to the surface of a sample 808. Prism 805 also directs the specular reflection from surface features of sample 808 and reflections from the optical surfaces of an objective 806 along the optical path to an image plane 809. Lenses for objective 806 can be provided in the general form of a catadioptric objective, a focusing lens group, and a zooming tube lens section 807. In a preferred embodiment, laser 801 can be implemented by the one of above-described lasers.

Figure 9A:
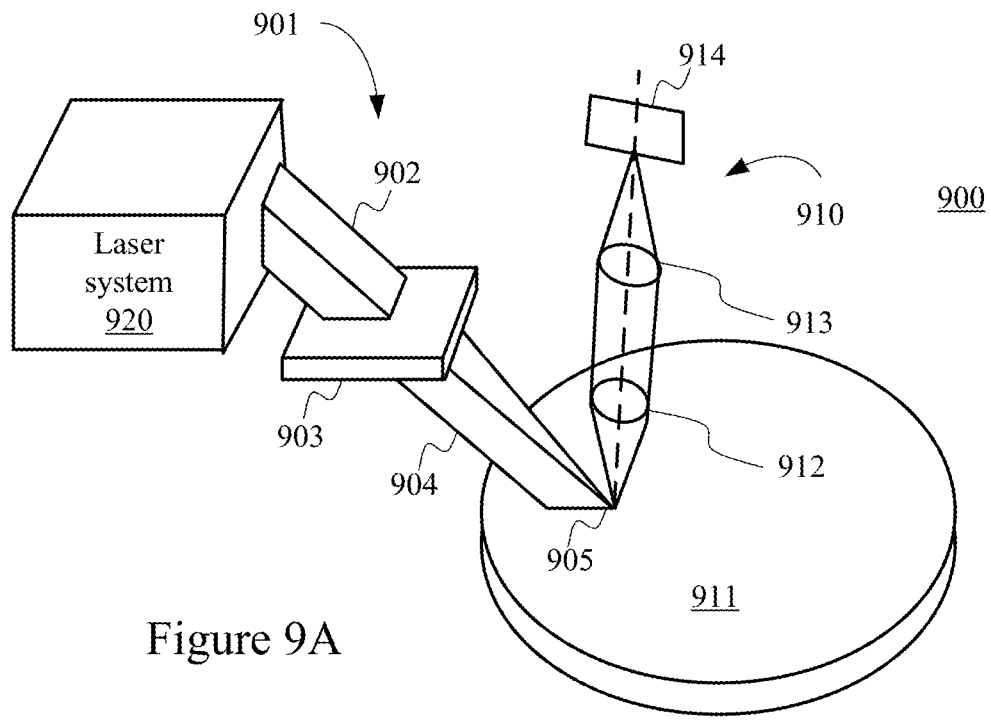
FIGS. 9A and 9B illustrates dark-field inspection systems that respectively utilize one of the laser assemblies described herein in accordance with another specific embodiment of the present invention.
Figure 9B:
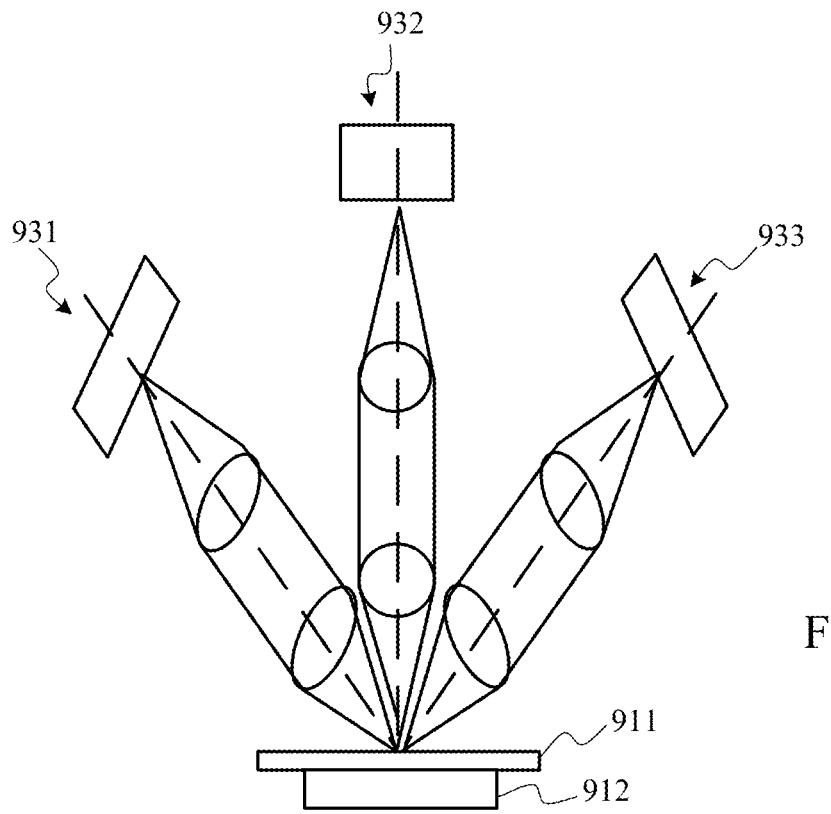
Figure 10:
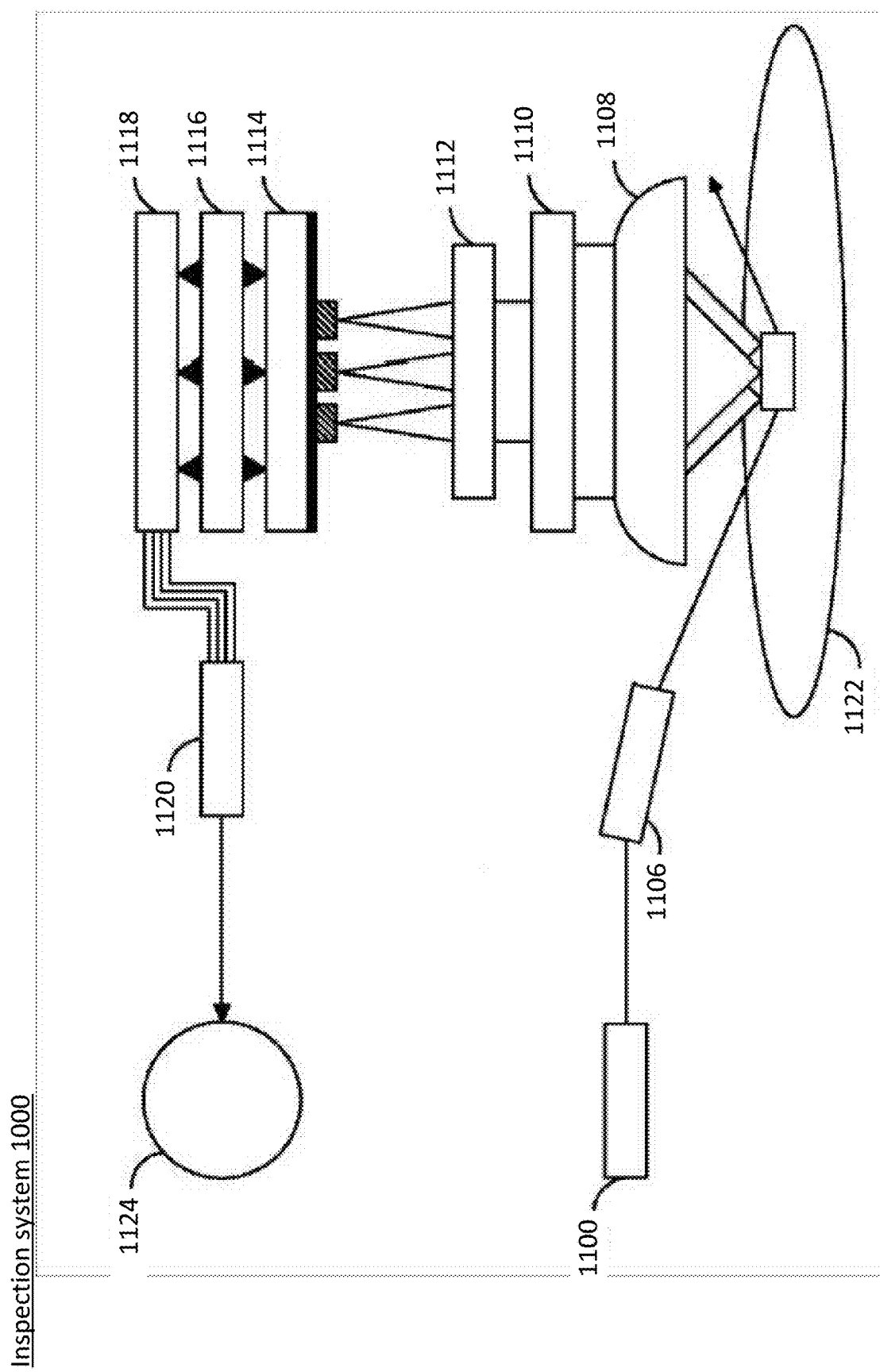
FIG. 10 illustrates an alternative dark-field inspection system configured for inspecting unpatterned wafers using one of the laser assemblies described herein in accordance with another specific embodiment of the present invention.

This laser may be used in a dark-field inspection system with oblique line illumination as shown in FIGS. 9A and 9B. This inspection system may have 2 or 3 different collection systems including off-axis and near normal collection as shown. This dark field inspection system may also include normal incidence line illumination (not shown). More details including an explanation of the system shown in FIGS. 9A and 9B can be found in U.S. Pat. No. 7,525,649 to Leong et al., which is incorporated by reference as if fully set forth herein.

FIG. 9A illustrates a surface inspection apparatus 900 that includes illumination system 901 and collection system 910 for inspecting areas of surface 911. As shown in FIG. 9A, a laser system 920 directs a light beam 902 through beam shaping optics 903. In a preferred embodiment, the laser system 920 includes at least one of the above-described laser assemblies (i.e., laser assemblies 100, 100A or 100B). First beam shaping optics 903 can be configured to receive a beam from the laser system, which is focused onto surface 911.

Beam shaping optics 903 is oriented so that its principal plane is substantially parallel to a sample surface 911 and, as a result, illumination line 905 is formed on surface 911 in the focal plane of beam shaping optics 903. In addition, light beam 902 and focused beam 904 are directed at a non-orthogonal angle of incidence to surface 911. In particular, light beam 902 and focused beam 904 may be directed at an angle between about 1° and about 85° from a normal direction to surface 911. In this manner, illumination line 905 is substantially in the plane of incidence of focused beam 904.

Collection system 910 includes lens 912 for collecting light scattered from illumination line 905 and lens 913 for focusing the light coming out of lens 912 onto a device, such as charge coupled device (CCD) 914, comprising an array of light sensitive detectors. In one embodiment, CCD 914 may include a linear array of detectors. In such cases, the linear array of detectors within CCD 914 can be oriented parallel to illumination line 905. In another embodiment, CCD 914 may include a two-dimensional array of detectors, arranged as a rectangular array with its long axis parallel to illumination line 905. For example, CCD 914 may comprise a rectangular array of approximately 1000 to 8000 detectors by approximately 50 to 250 detectors. In one embodiment, multiple collection systems can be included, wherein each of the collection systems includes similar components, but differ in orientation.

For example, FIG. 9B illustrates an exemplary array of collection systems 931, 932, and 933 for a surface inspection apparatus (wherein its illumination system, e.g., similar to that of illumination system 901, is not shown for simplicity). First optics in collection system 931 collect light scattered in a first direction from the surface of sample 911. Second optics in collection system 932 collect light scattered in a second direction from the surface of sample 911. Third optics in collection system 933 collect light scattered in a third direction from the surface of sample 911. Note that the first, second, and third paths are at different angles of reflection to said surface of sample 911. A platform 912 supporting sample 911 can be used to cause relative motion between the optics and sample 911 so that the whole surface of sample 911 can be scanned.

The lasers described herein may also be used in inspection systems for unpatterned wafers such as inspection system 1000 shown in FIG. 10. Such an inspection system may incorporate oblique and/or normal incidence illumination and a large collection solid angle for the scattered light as shown in these figures. Illumination source 1100 incorporates any of laser assemblies 100, 100A or 100B to generate DUV or VUV light to illuminate wafer 1122 at a desirable angle to ensure that reflected light is not collected by a system of imaging collection optics 1108. Optics 1106 may be configured to generate the desired illumination pattern. Scattered light from the wafer 1122 may be collected by a system of imaging collection optics 1108 configured to direct the light into an afocal lens system 1110. In one embodiment collection lens mask system 1112 may divide the light into a plurality of channels for delivery to a TDI sensor 1118. One embodiment may include an intensifier 1114 and/or a sensor relay 1116. TDI sensor 1118 and/or intensifier 1114 may be configured to transmit signals to image processing computer 1120, which may be configured to generate a wafer image and/or a list of defects or particles on the surface of wafer 1122. Additional explanation of the elements of FIG. 10 can be found in U.S. Pat. No. 9,891,177B2 to Vazhaeparambil et al. Further details on unpatterned wafer inspection systems can be found in U.S. Pat. Nos. 6,201,601 and 6,271,916. All of these patents are incorporated by reference as if fully set forth herein.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A tunable laser assembly for generating a deep ultraviolet (DUV) output light having a tunable output frequency with a corresponding wavelength that is selectively adjustable in the range of approximately 184 nm to approximately 200 nm, said tunable laser assembly comprising:

one or more fundamental lasers respectively configured to generate fundamental light having at least one corresponding fundamental frequency with a corresponding fundamental wavelength between about 1 μm and 1.1 μm;

a fifth harmonic generator configured to receive a first portion of the fundamental light and to generate fifth harmonic light having a fifth harmonic frequency equal to five times the fundamental frequency;
a fan-out periodically poled nonlinear crystal configured to receive a second portion of the fundamental light;
first and second nonlinear summing crystals; and
a frequency control system configured to cooperatively adjust relative positions and orientations of the fan-out periodically poled nonlinear crystal and the first and second nonlinear summing crystals in response to an output frequency signal such that:
when said output frequency signal has a first value, the frequency control system causes the second portion to pass through a first region of the fan-out periodically poled nonlinear crystal, thereby generating a first down-converted signal having a first down-converted frequency, and the frequency control system positions the first nonlinear summing crystal to receive both the fifth harmonic light and the first down-converted signal, thereby generating said DUV output light with a first wavelength within said range; and
when said output frequency signal has a second value, the frequency control system causes the second portion to pass through a second region of the fan-out periodically poled nonlinear crystal, thereby generating a second down-converted signal having a second down-converted frequency, and the frequency control system positions the second nonlinear summing crystal to receive both the fifth harmonic light and the second down-converted signal, thereby generating said DUV output light with a second wavelength within said range.

2. The tunable laser assembly of claim 1,
wherein the fan-out periodically poled nonlinear crystal has opposing first and second side edges and opposing first and second end edges and includes a poling period that gradually changes from a first period adjacent said first side edge to a second period adjacent said second side edge, said first period being greater than said second period,
wherein when the frequency control system causes the second portion to pass through the first region, the second portion passes between the opposing first and second end edges along a path that is closer to the first side edge than said second side edge, and
wherein when the frequency control system causes the second portion to pass through the second region, the second portion passes between the opposing first and second end edges along a path that is closer to the first side edge than said second side edge.

3. The tunable laser assembly of claim 2, wherein the fan-out periodically poled nonlinear crystal comprises one of lithium niobate (PPLN), magnesium-oxide doped lithium niobate (Mg:LN), stoichiometric lithium tantalate (SLT), magnesium-oxide doped stoichiometric lithium tantalate (Mg:SLT) and potassium titanyl phosphate (KTP).

4. The tunable laser assembly of claim 1,
wherein the first nonlinear summing crystal has a first crystal axis and the second nonlinear summing crystal has a second crystal axis,
wherein, when said output frequency signal has said first value, the frequency control system positions the first nonlinear summing crystal such that the first down-converted signal passes through the first nonlinear summing crystal in a first light propagation direction that forms a first angle relative to the first crystal axis,
wherein, when said output frequency signal has said second value, the frequency control system positions the second nonlinear summing crystal such that the second down-converted signal passes through the second nonlinear summing crystal in a second light propagation direction that forms a second angle relative to the second crystal axis, and
wherein the first angle differs from the second angle by at least 5 degrees.

5. The tunable laser assembly of claim 1, wherein each of the first and second nonlinear summing crystals comprises one of an annealed cesium lithium borate (CLBO) crystal and a strontium tetraborate (SBO) crystal.

6. The tunable laser assembly of claim 1,
wherein the first and second nonlinear summing crystals are fixedly connected to a frame,
wherein the frequency control system includes:
a first controller configured to move the fan-out periodically poled nonlinear crystal such that the first controller causes the second portion to pass through the first region when said output frequency signal has a first value, and such that the first controller causes the second portion to pass through the second region when said output frequency signal has a second value; and
a second controller configured to move the frame into a first position such that the first down-converted signal passes through the first nonlinear summing crystal when said output frequency signal has the first value and such that the second down-converted signal passes through the second nonlinear summing crystal when said output frequency signal has the second value.

7. The tunable laser assembly of claim 6, further comprising a wavelength selector positioned to receive the down-converted signal, and wherein the frequency control system is further configured to control the wavelength selector such that the wavelength selector is configured to filter out frequencies falling outside of an effective bandwidth centered around said first down-converted frequency when said output frequency signal has said first value, and such that the wavelength selector is configured to filter out frequencies falling outside of said effective bandwidth centered around said second down-converted frequency when said output frequency signal has said second value.

8. The tunable laser assembly of claim 1, further comprising:
an optical parametric system (OPS) optically coupled to receive the second fundamental light and configured to direct the second fundamental light through at least one of the fan-out periodically poled nonlinear crystal and a wavelength selector; and
a frequency summing stage optically coupled to receive the down-converted signal from the OPS and the fifth harmonic light from the fifth harmonic generation stage, said frequency summing stage being configured to direct the down-converted signal and the fifth harmonic light through one of said first and second summing crystals.

9. The tunable laser assembly of claim 8, wherein the fifth harmonic generator comprises:
a beam splitter configured to receive and split the first portion of the fundamental light into a first fundamental part and a second fundamental part;
a fourth harmonic generation module optically coupled to receive a first fundamental part and configured to generate a fourth harmonic light having a fourth harmonic frequency equal to four times the fundamental frequency; and
a fifth harmonic generation stage optically coupled to receive both the second fundamental part and to receive said fourth harmonic light, said fifth harmonic generation stage being configured to generate said fifth harmonic light by mixing said fourth harmonic light and said fundamental part.

10. The tunable laser assembly of claim 8, wherein the OPS further comprises a first focusing mirror and a second focusing mirror that are operably configured to form a cavity with said wavelength selector in which light is reflected between said wavelength selector and said first and second focusing mirrors such that the reflected light passes through the fan-out periodically poled nonlinear crystal.

11. The tunable laser assembly of claim 10, wherein the wavelength selector comprises one of a volume Bragg grating, a distributed Bragg reflector, and a Littrow grating.

12. The tunable laser assembly of claim 11, further comprising means for maintaining the wavelength selector at a constant temperature.

13. The tunable laser assembly of claim 8, wherein the OPS further comprises a first focusing mirror, a second focusing mirror, a third mirror and a fourth mirror that are operably configured to form a cavity in which light is directed through both the fan-out periodically poled nonlinear crystal and the wavelength selector.

14. The tunable laser assembly of claim 13, wherein the wavelength selector comprises one of a transmission grating and an etalon.

15. The tunable laser of claim 8, wherein the frequency summing stage further comprises a plurality of reflective optical elements collectively configured to form a cavity that circulates an unconsumed portion of light at the down-converted frequency such that the unconsumed portion is combined with the down-converted signal received from the OPS before being directed through said one of said first and second summing crystals, and wherein each of the first and second summing crystals comprises one of an annealed cesium lithium borate (CLBO) crystal and a strontium tetraborate (SBO) crystal.

16. The tunable laser of claim 1, further comprising a single cavity arrangement configured to circulate unconsumed down-converted light exiting one of said first and second nonlinear summing crystals such that said unconsumed down-converted light is directed through said fan-out periodically poled nonlinear crystal.

17. The tunable laser of claim 16, wherein single cavity arrangement comprises:
   a first mirror configured to reflect said unconsumed down-converted light through said fan-out periodically poled nonlinear crystal;
   a second mirror configured to receive light from said fan-out periodically poled nonlinear crystal and to reflect a portion of said received light having said down-converted frequency, said reflected light portion including said down-converted signal generated by said periodically poled nonlinear crystal;
   a third mirror configured to receive said reflected light portion from the second mirror;
   a fourth mirror configured to reflect said reflected light portion received from the third mirror through said one of said first and second nonlinear summing crystals;
   a fifth mirror configured to reflect said unconsumed down-converted light exiting said one of said first and second nonlinear summing crystals; and
   a sixth mirror configured to reflect said unconsumed down-converted light received from the fifth mirror to the first mirror.

18. The tunable laser of claim 1,
wherein the tunable laser further comprises a third frequency summing crystal, and
wherein the frequency control system is further configured to cooperatively adjust relative positions and orientations of the fan-out periodically poled nonlinear crystal and the first, second and third nonlinear summing crystals in response to said output frequency signal such that, when said output frequency signal has a third value, the frequency control system causes the second portion to pass through a third region of the fan-out periodically poled nonlinear crystal, thereby generating a third down-converted signal having a third down-converted frequency, and the frequency control system positions the third nonlinear summing crystal to receive both the fifth harmonic light and the third down-converted signal, thereby generating said DUV output light with a third output wavelength that differs from both the first output wavelength and the second output wavelength by at least 5 nm.

19. An inspection system comprising:
a laser assembly configured to generate laser output light having an output wavelength in the range of approximately 184 nm to approximately 200 nm;
first optics configured to direct the laser output light from the laser assembly to an object being inspected;
second optics configured to collect an image portion of said laser output light affected by the object being inspected, and to direct the image portion to one or more sensors,
wherein the laser assembly comprises:
one or more fundamental lasers respectively configured to generate fundamental light having at least one corresponding fundamental frequency with a corresponding fundamental wavelength between about 1 μm and 1.1 μm;
a fifth harmonic generator configured to receive a first portion of the fundamental light and to generate fifth harmonic light having a fifth harmonic frequency equal to five times the fundamental frequency;
a fan-out periodically poled nonlinear crystal configured to receive a second portion of the fundamental light;
first and second nonlinear summing crystals; and
a frequency control system configured to cooperatively adjust relative positions of the fan-out periodically poled nonlinear crystal and the nonlinear summing crystal in response to an output frequency signal such that:
when said output frequency signal has a first value, the frequency control system causes the second portion to pass through a first region of the fan-out periodically poled nonlinear crystal, thereby generating a first down-converted signal having a first down-converted frequency, and the frequency control system positions the first nonlinear summing crystal to receive both the fifth harmonic light and the first down-converted signal, thereby generating said DUV output light with a first wavelength within said range; and
when said output frequency signal has a second value, the frequency control system causes the second portion to pass through a second region of the fan-out periodically poled nonlinear crystal, thereby generating a second down-converted signal having a second down-converted frequency, and the frequency control system positions the second nonlinear summing crystal to receive both the fifth harmonic light and the second down-converted signal, thereby generating said DUV output light with a second wavelength within said range.

20. A method of operating a tunable laser assembly such that the tunable laser assembly generates first deep ultraviolet (DUV) output light having a first DUV wavelength during a first time period and generates second DUV output light having a second DUV wavelength during a second time period, both said first and second DUV wavelengths being in the range of approximately 184 nm to approximately 200 nm, the method comprising:

generating fundamental light having a fundamental frequency with a corresponding fundamental wavelength between about 1 μm and 1.1 μm;

utilizing a first portion of the fundamental light to generate fifth harmonic light having a fifth harmonic frequency equal to five times the fundamental frequency;

during the first time period, directing a second portion of the fundamental light through a first region of a fan-out periodically poled nonlinear crystal such that the fan-out periodically poled nonlinear crystal generates a first down-converted signal having a first down-converted frequency with a corresponding wavelength between approximately 1350 nm and 3300 nm, and directing both the first down-converted signal and the fifth harmonic light through a first nonlinear summing crystal such that the first nonlinear summing crystal generates said first DUV output light with said first wavelength; and during the second time period, directing said second portion of the fundamental light through a second region of a fan-out periodically poled nonlinear crystal such that the fan-out periodically poled nonlinear crystal generates a second down-converted signal having a second down-converted frequency with a corresponding wavelength between approximately 1350 nm and 3300 nm, and directing both the second down-converted signal and the fifth harmonic light through a second nonlinear summing crystal such that the second nonlinear summing crystal generates said second DUV output light with said second wavelength, wherein the first nonlinear summing crystal has a first crystal axis and is positioned during the first time period such that the first down-converted signal passes through the first nonlinear summing crystal in a first light propagation direction that forms a first angle relative to the first crystal axis, wherein the second nonlinear summing crystal has a second crystal axis and is positioned during the second time period such that the second down-converted signal passes through the second nonlinear summing crystal in a second light propagation direction that forms a second angle relative to the second crystal axis, and wherein the first angle differs from the second angle by at least 5 degrees.

* * * * *